United States Patent
Choi et al.

(10) Patent No.: US 8,759,147 B2
(45) Date of Patent: Jun. 24, 2014

(54) SEMICONDUCTOR PACKAGES AND METHODS OF FABRICATING THE SAME

(75) Inventors: Eun-Kyoung Choi, Gyeonggi-do (KR); SeYoung Jeong, Suwon-si (KR); Kwang-chul Choi, Suwon-si (KR); Tae Hong Min, Gumi-si (KR); Chungsun Lee, Gunpo-si (KR); Jung-Hwan Kim, Bucheon-si (KR)

(73) Assignee: Samsung Electronics Co., Ltd. (KR)

( * ) Notice: Subject to any disclaimer, the term of this patent is extended or adjusted under 35 U.S.C. 154(b) by 32 days.

(21) Appl. No.: 13/235,372

(22) Filed: Sep. 17, 2011

(65) Prior Publication Data

US 2012/0171814 A1   Jul. 5, 2012

(30) Foreign Application Priority Data

Dec. 31, 2010   (KR) .................. 10-2010-0139991

(51) Int. Cl.
  *H01L 21/00*   (2006.01)
(52) U.S. Cl.
  USPC ............................ 438/106; 438/110; 257/678
(58) Field of Classification Search
  None
  See application file for complete search history.

(56) References Cited

U.S. PATENT DOCUMENTS

| | | | |
|---|---|---|---|
| 7,001,841 B2 * | 2/2006 | Hirao et al. ................ | 438/660 |
| 7,675,181 B2 * | 3/2010 | Lee ............................. | 257/777 |
| 7,776,648 B2 | 8/2010 | Chua et al. | |
| 7,995,633 B2 * | 8/2011 | Dachs et al. ............... | 372/43.01 |
| 7,998,791 B2 * | 8/2011 | Chong et al. .............. | 438/112 |
| 8,012,799 B1 * | 9/2011 | Ibrahim et al. ............ | 438/107 |
| 8,237,252 B2 * | 8/2012 | Pagaila et al. ............. | 257/686 |
| 8,304,907 B2 * | 11/2012 | Lin et al. .................... | 257/762 |
| 8,334,588 B2 * | 12/2012 | Lee et al. ................... | 257/692 |
| 2006/0172457 A1 * | 8/2006 | Huang ........................ | 438/106 |
| 2006/0231944 A1 * | 10/2006 | Huang et al. .............. | 257/706 |
| 2007/0029683 A1 * | 2/2007 | Tsai et al. .................. | 257/796 |
| 2008/0032450 A1 * | 2/2008 | Huang ........................ | 438/108 |
| 2009/0194868 A1 * | 8/2009 | Chong et al. .............. | 257/712 |
| 2009/0224422 A1 * | 9/2009 | Dubin ......................... | 264/259 |
| 2011/0128980 A1 * | 6/2011 | Kato ........................... | 372/43.01 |
| 2012/0038057 A1 * | 2/2012 | Bartley et al. ............. | 257/774 |
| 2012/0104624 A1 * | 5/2012 | Choi et al. ................. | 257/774 |
| 2012/0171814 A1 * | 7/2012 | Choi et al. ................. | 438/107 |
| 2012/0193779 A1 * | 8/2012 | Lee et al. ................... | 257/737 |
| 2013/0026643 A1 * | 1/2013 | England et al. ............ | 257/774 |

FOREIGN PATENT DOCUMENTS

| | | | |
|---|---|---|---|
| DE | GB 1360213 | * | 7/1974 |
| KR | 1020090103505 A | | 1/2009 |
| KR | 1020100069007 A | | 6/2010 |

* cited by examiner

*Primary Examiner* — Telly Green
(74) *Attorney, Agent, or Firm* — Renaissance IP Law Group LLP

(57) ABSTRACT

Provided are a semiconductor package and a method of fabricating the same. In one embodiment, to fabricate a semiconductor package, a wafer having semiconductor chips fabricated therein is provided. A heat sink layer is formed over the wafer. The heat sink layer contacts top surfaces of the semiconductor chips. Thereafter, the plurality of semiconductor chips are singulated from the wafer.

18 Claims, 35 Drawing Sheets

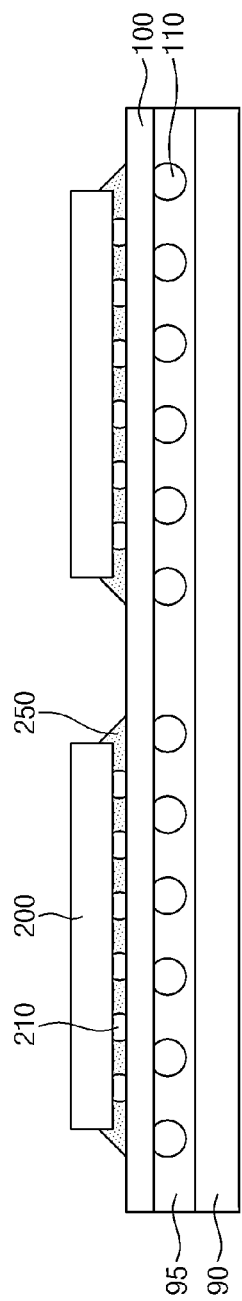

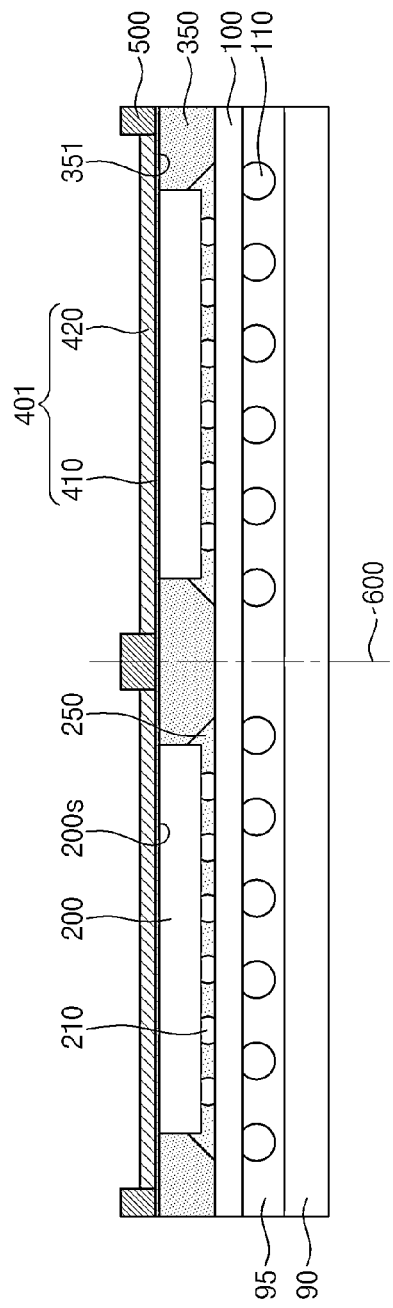

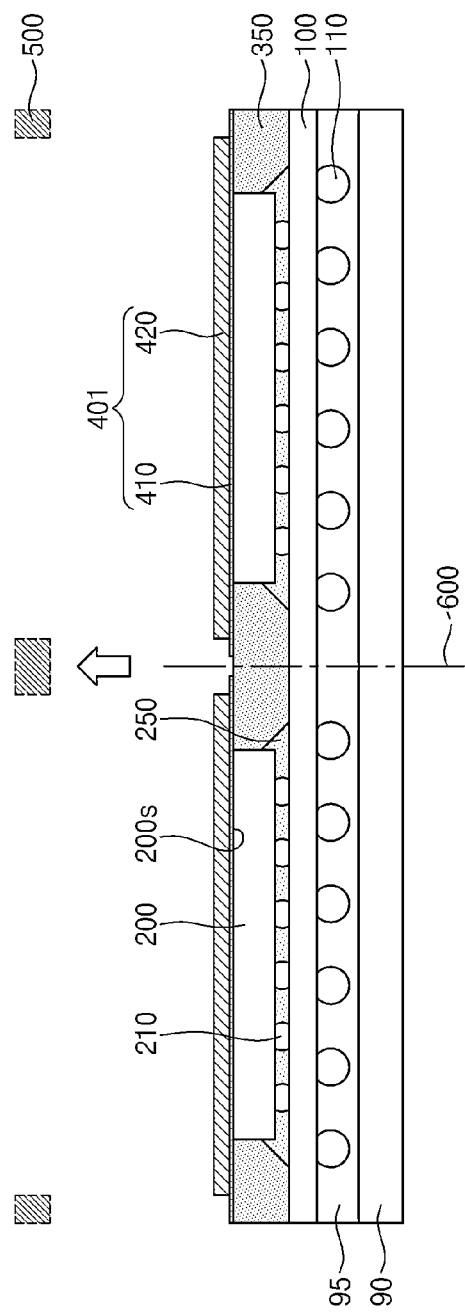

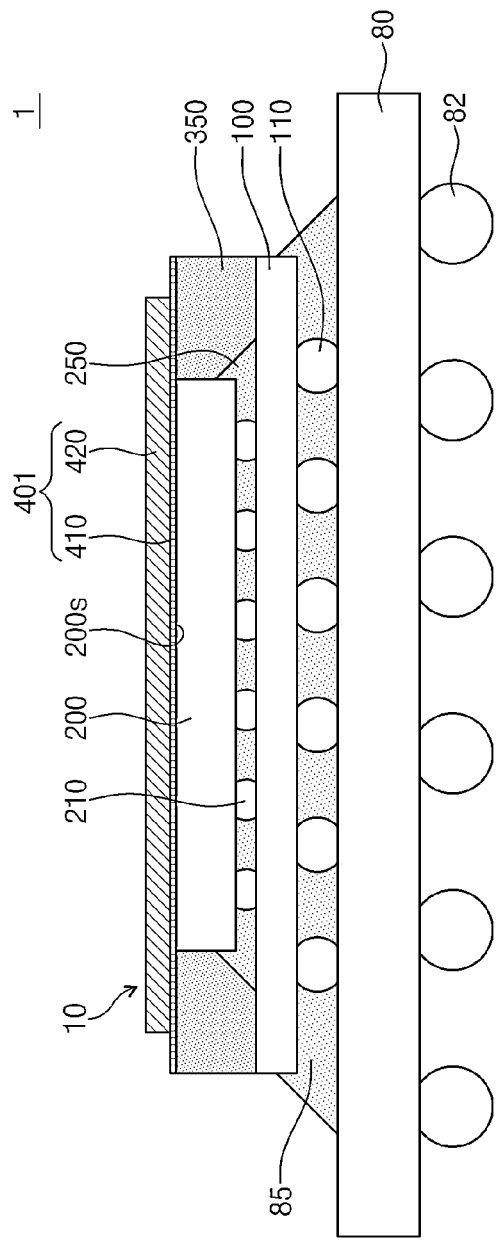

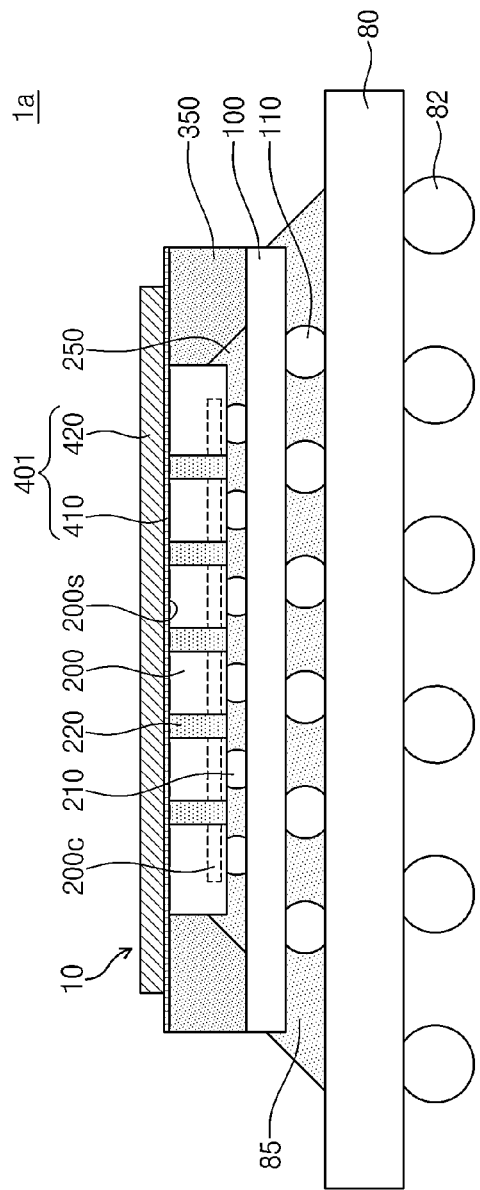

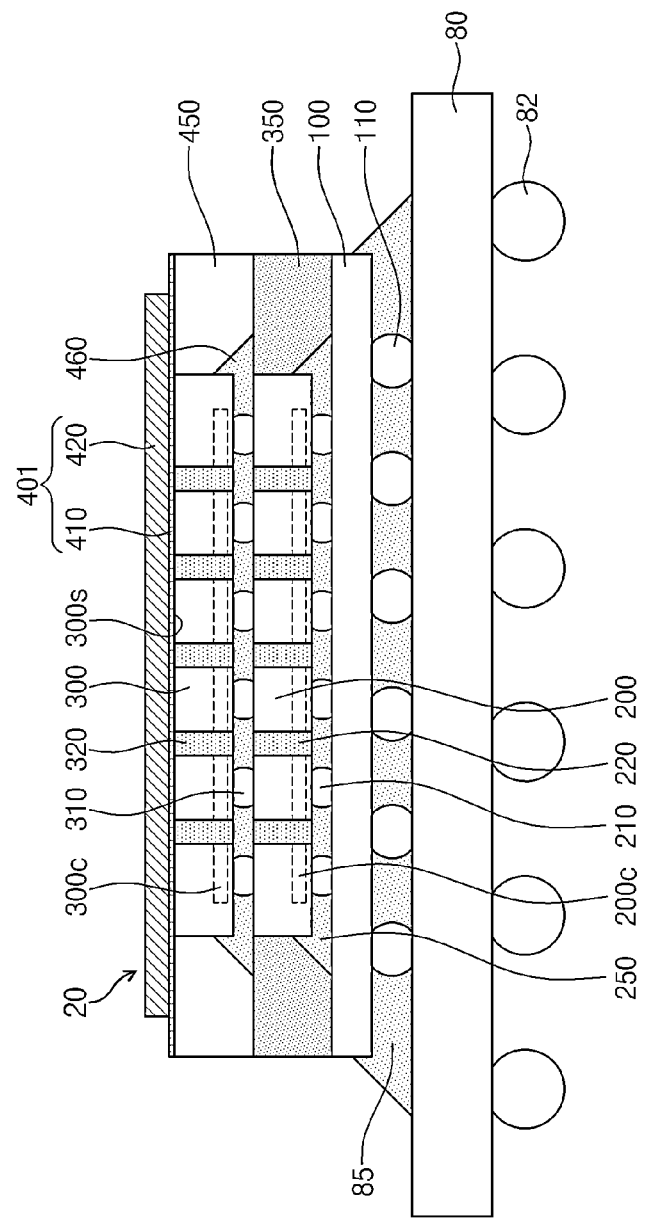

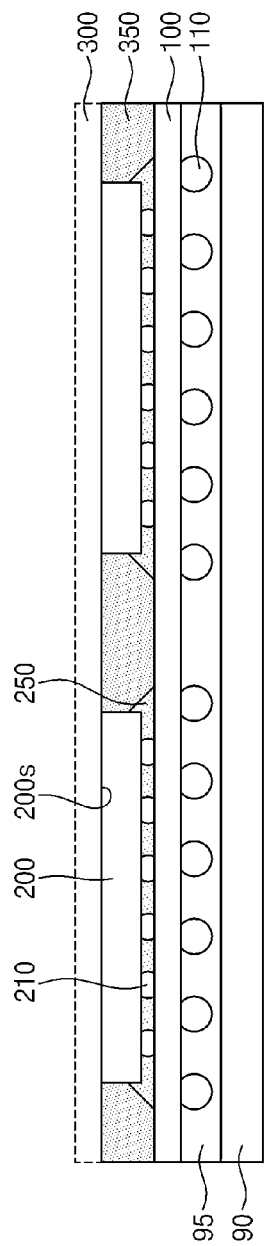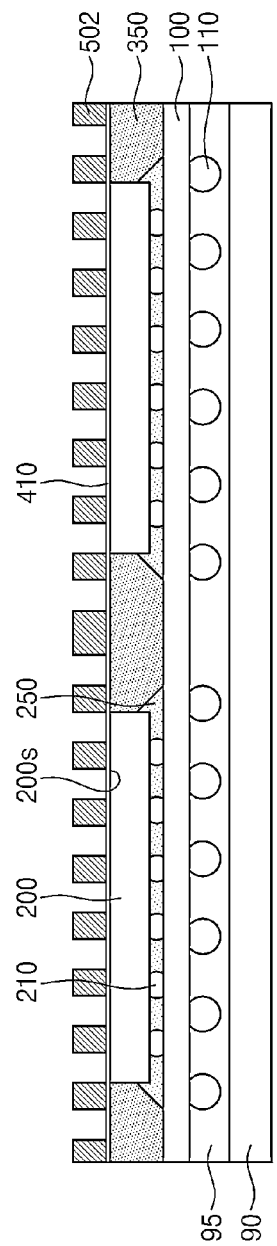

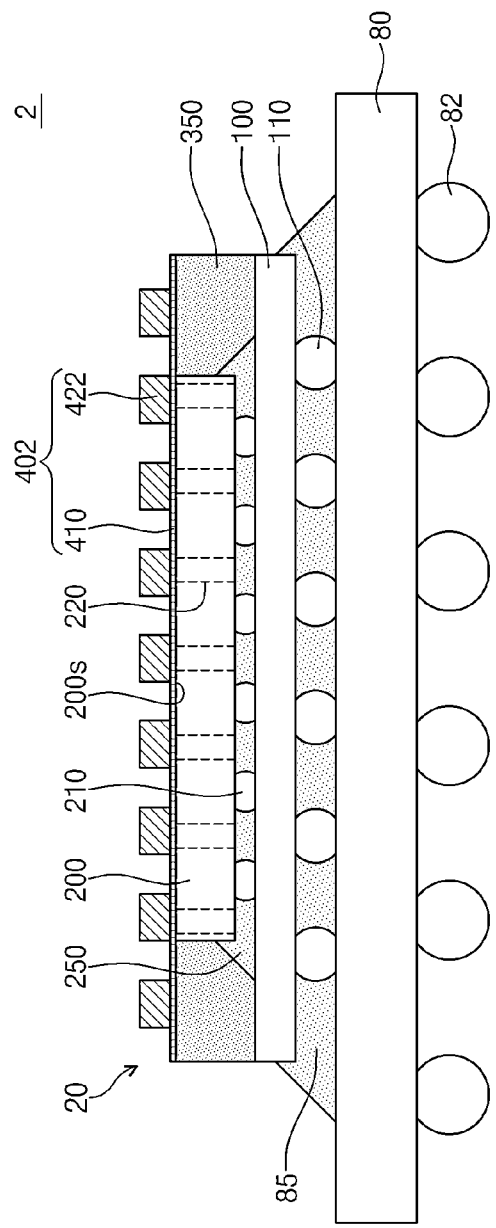

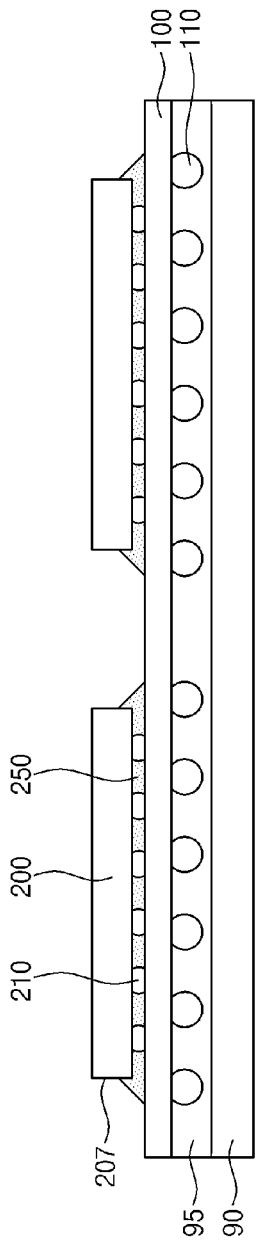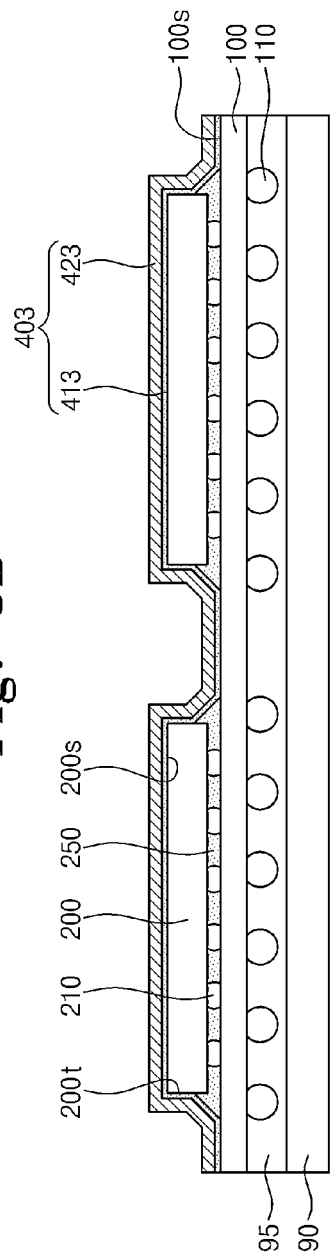

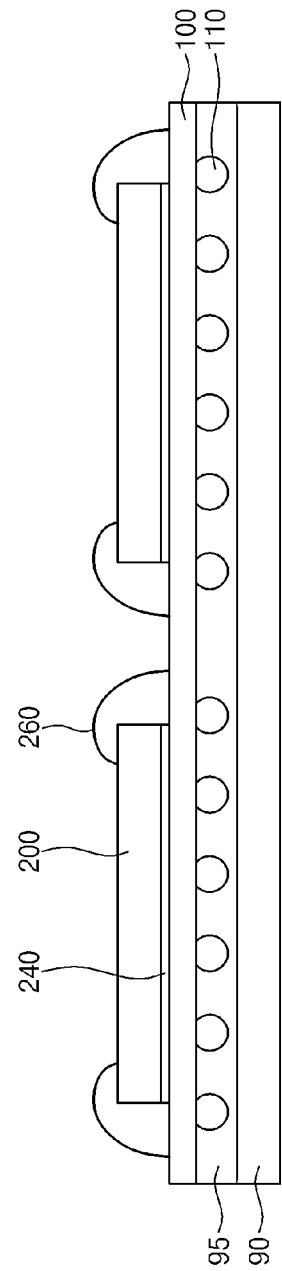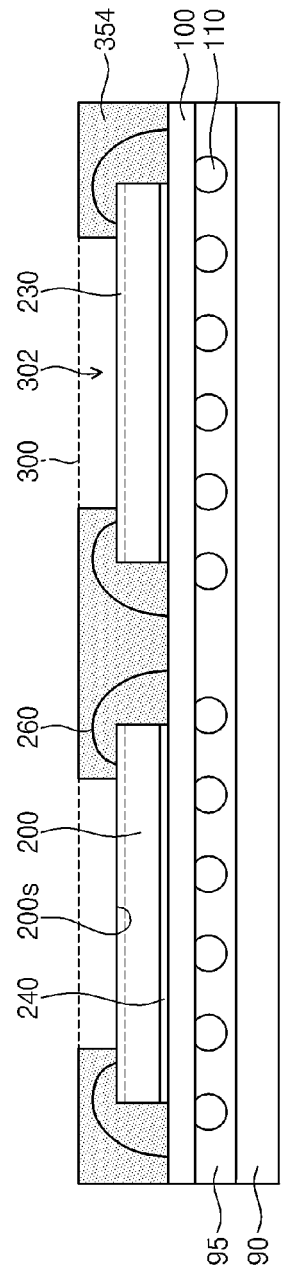

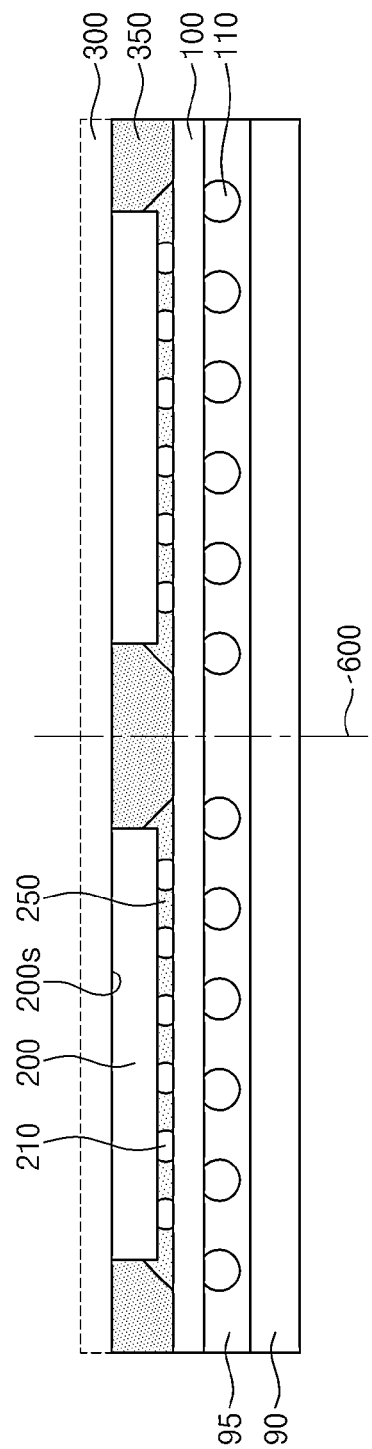

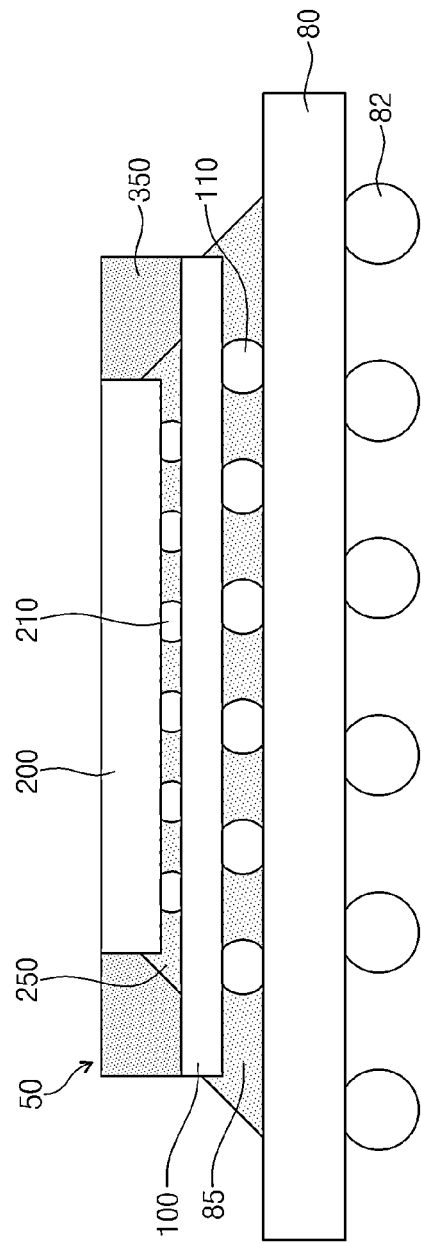

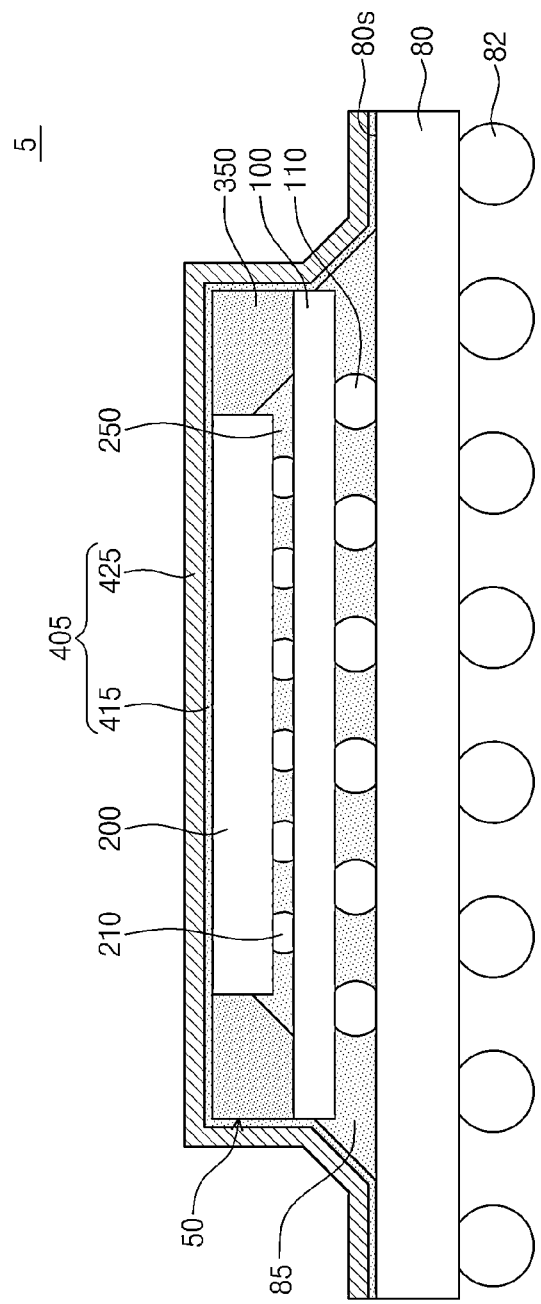

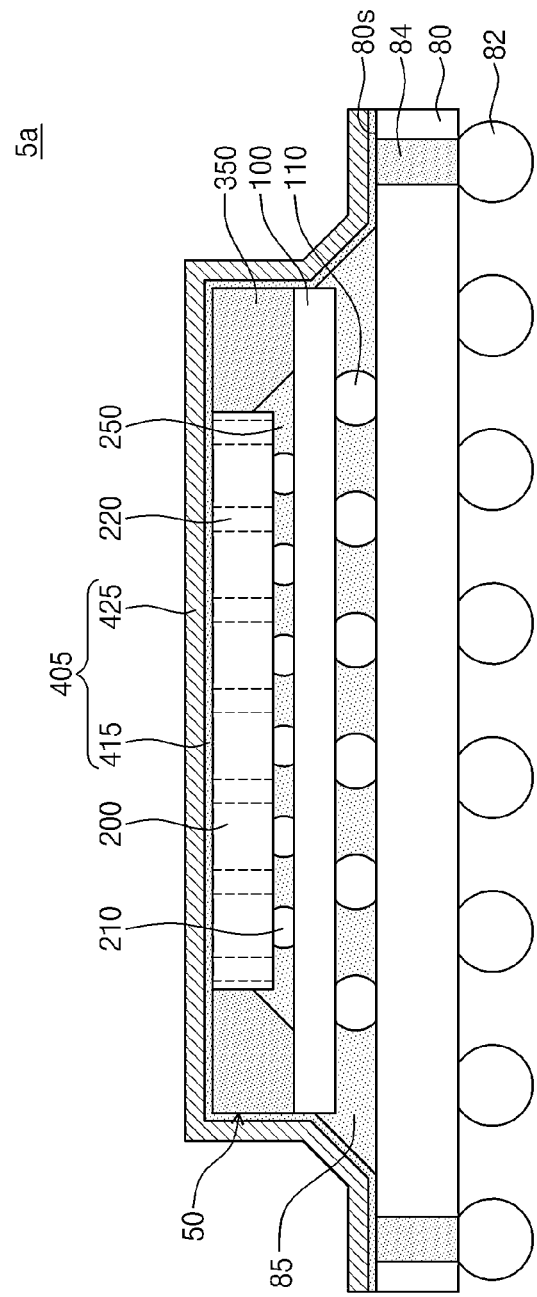

SEMICONDUCTOR PACKAGES AND METHODS OF FABRICATING THE SAME

CROSS-REFERENCE TO RELATED APPLICATIONS

This U.S. non-provisional patent application claims priority under 35 U.S.C. §119 of Korean Patent Application No. 10-2010-0139991, filed on Dec. 31, 2010, the entire contents of which are hereby incorporated by reference.

BACKGROUND

The present disclosure herein relates to a semiconductor, and more particularly, to a semiconductor package and a method of fabricating the same.

Integrated circuit packaging technologies are constantly being advanced to meet the demands for miniaturization of semiconductor packages and higher mounting reliability. In particular, improving efficiency of mounting processes and mechanical and electrical reliabilities after mounting has become an important goal for the semiconductor industry. Without proper treatment, excessive heat generation due to high power consumption during the operation of the semiconductor device may deteriorate reliability of a semiconductor package.

SUMMARY

The present disclosure provides a semiconductor package having improved reliability and a method of fabricating the same.

In one embodiment, a method of fabricating a semiconductor package including: providing a wafer having semiconductor chips fabricated therein; forming a heat sink layer over the wafer, the heat sink layer contacting top surfaces of the semiconductor chips; and thereafter, singulating the plurality of semiconductor chips from the wafer.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIGS. 1A through 1K are sectional views illustrating a method of fabricating a semiconductor package according to an embodiment of the inventive concept;

FIG. 1N is a sectional view illustrating a method of fabricating a semiconductor package according to an embodiment of the inventive concept;

FIGS. 2A through 2F are sectional views illustrating a method of fabricating a semiconductor package according to another embodiment of the inventive concept;

FIGS. 3A through 3E are sectional views illustrating a method of fabricating a semiconductor package according to yet another embodiment of the inventive concept;

FIGS. 4A through 4G are sectional views illustrating a method of fabricating a semiconductor package according to an embodiment of the inventive concept;

FIGS. 5A through 5E are sectional views illustrating a method of fabricating a semiconductor package according to another embodiment of the inventive concept;

DETAILED DESCRIPTION OF THE EMBODIMENTS

Figure 1B:
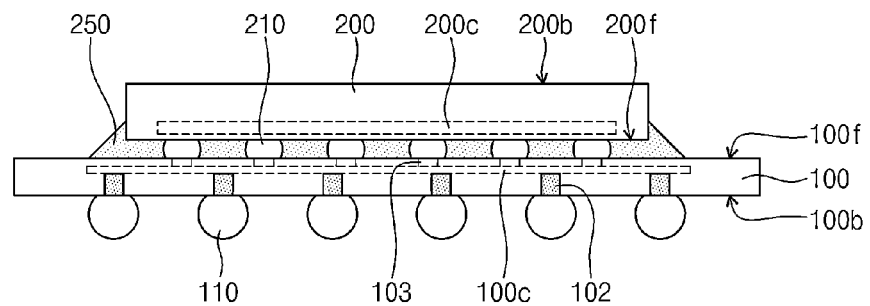

Hereinafter, exemplary embodiments of the inventive concept will be described in detail with reference to the accompanying drawings.

Exemplary embodiments of the inventive concept will be described below in more detail with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

The terms used in the present specification are merely used to describe particular embodiments, and are not intended to limit the inventive concept. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiment 1

FIGS. 1A through 1K are sectional views illustrating a method of fabricating a semiconductor package according to an embodiment of the inventive concept. FIG. 1L is a perspective view of a heat sink layer in a method of fabricating a semiconductor package according to another embodiment of the inventive concept.

Referring to FIG. 1A, a second semiconductor chip 200 may be stacked on a first semiconductor chip 100. A carrier 90 may be provided to handle the first and second semiconductor chip 100 and 200 easily and to reduce warpage and/or damage. As one example, the first semiconductor chip 100 may be mounted on the carrier 90 with an adhesive layer 95 interposed therebetween and the second semiconductor chip 200 may be stacked on the first semiconductor chip 100. The carrier 90 may include silicon, metal, glass, and so forth.

The first semiconductor chip 100 and the second semiconductor chip 200 may be the same chip or different chips. As one example, the first semiconductor chip 100 may be a logic chip and the second semiconductor chip 200 may be a memory chip or vice versa.

The first semiconductor chip 100 may be a semiconductor chip included in a wafer without being singulated, i.e., at a wafer level. Therefore, the semiconductor chips 100 may be referred to as being at a wafer level when the semiconductor chips are included in the wafer before being singulated. On the other hand, the second semiconductor chip 200 may be referred to as being at a chip level, i.e., the second semiconductor chip 200 being a singulated semiconductor chip or die. According to one embodiment, a plurality of memory chips 200 at a chip level may be stacked on the first semiconductor chip 100 at a wafer level. If the second semiconductor chip 200, previously determined as a known good die (KGD), is provided on the first semiconductor chip 100, overall yield may be improved. External connection terminals such as solder balls 110 may be provided on the first semiconductor chip 100. The solder balls 110 may electrically connect the logic and memory chips 100 and 200 to an electrical device such as a printed circuit substrate 80 of FIG. 1J.

The first semiconductor chip 100 and the second semiconductor chip 200 may be electrically interconnected through conductive bump or conductive balls such as solder balls 210, which will be described later with reference to FIG. 1B or 1C. Depending on the application, an under filling layer 250 surrounding the solder ball 210 may be provided between the first semiconductor chip 100 and the second semiconductor chip 200 to improve the solder joint reliability of the solder balls 210.

Referring to FIG. 1B, the first semiconductor chip 100 may be provided in a face up manner, where an active surface 100f having a logic circuit 100c may face upward and an opposite, inactive surface 100b may face downward. The solder balls 100 may be attached to the inactive surface 100b of the first semiconductor chip 100. The first semiconductor chip 100 may include a through via 102 such as a Through Silicon Via (TSV) for electrically connecting the solder ball 110 with the logic circuit 100c. In FIG. 1B, the through via 102 is directly coupled to the logic circuit 100c. However, there may be additional conductive patterns formed between the through via 102 and the logic circuit 100c.

In some embodiments, the first semiconductor chip 100 may include a connection pattern 103 such as metal wiring, via, and/or bonding pad for electrically connecting the solder ball 210 with the logic circuit 100c. As another example, the first semiconductor chip 100 may be provided in a face down manner, where the active surface 100f faces downward and the inactive surface 100b faces upward.

The second semiconductor chip 200 may be electrically bonded to the first semiconductor chip 100 using various interconnection methods such as a flip chip technology. For example, the second semiconductor chip 200 may be stacked on the first memory chip 100 where an active surface 200f having a memory circuit 200c of the second semiconductor chip 200 may face downward to face the active surface 100f of the first semiconductor chip 100 and an inactive surface 200b opposite thereto may face upward. Since the solder ball 210, which is electrically connected to the memory circuit 200c, is connected to the connection pattern 103 of the first semiconductor chip 100, the first semiconductor chip 100 and the second semiconductor chip 200 may be electrically connected to each other.

Figure 1C:
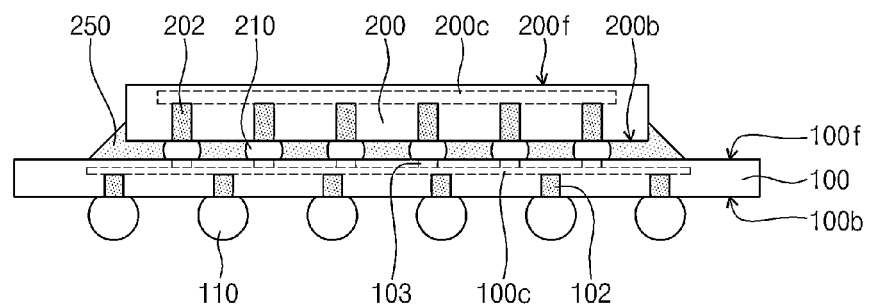

Referring to FIG. 1C, the second semiconductor chip 200 may be stacked in a face up manner on the first semiconductor chip 100, which may be arranged either face up or face down. For example, the active surface 200f may face upward and the inactive surface 200b may face downward. The second semiconductor chip 200 may include a via 202 such as a TSV for electrically connecting the memory circuit 200c with the solder ball 210.

Figure 1D:
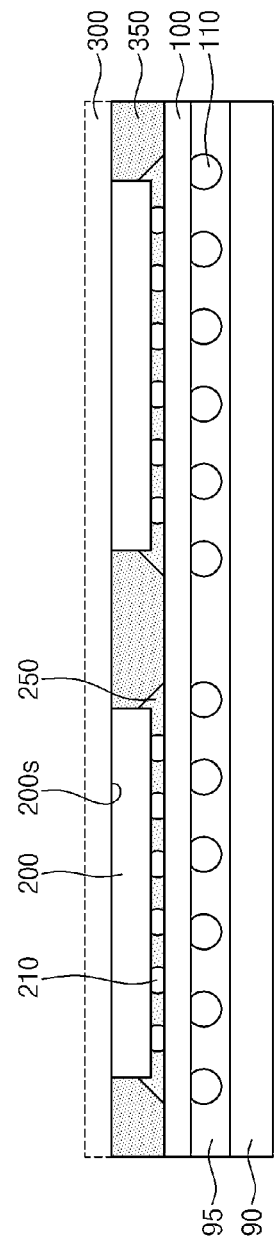

Referring to FIG. 1D, a planarized molding layer 350 exposing the top surface 200s of the second semiconductor chip 200 may be formed. For example, a molding layer 300 (indicated by a broken line) having a sufficient thickness to cover the second semiconductor chip 200 may be formed of an encapsulation material such as an epoxy molding compound (EMC). The molding layer 300 may be formed using a compression mold to cover the first and second semiconductor chips 100, 200. The molding layer 300 may then be planarized until a top surface 200s of the second semiconductor chip 200 is exposed to form a planarized molding layer 350 that may expose substantially the entire top surface 200s of the second semiconductor chip 200.

In some embodiments, the molding layer 300 and the second semiconductor chips 200 may be simultaneously grinded to expose top surfaces of the plurality of second semiconductor chips 200.

In some embodiments, the molding layer 300 may be planarized until a top surface 200s of the second semiconductor chip 200 is exposed such that a top surface of the planarized molding layer 350 is substantially coplanar with the top surface 200s of the second semiconductor chip 200.

To further distinguish the molding layer 300 from the molding layer 350 in this specification, the molding layer 300 is designated as a resin layer. A top surface of the planarized molding layer 350 may be at substantially the same level as the top surface 200s of the second semiconductor chip 200 as discussed. The top surface 200s may be the inactive surface 200b when the second semiconductor chip 200 faces down as shown in FIG. 1B and may be the active surface 200f when the second semiconductor chip 200 faces up as shown in FIG. 1C. According to this embodiment, the second semiconductor chip 200 may be bonded, e.g., flip-chip bonded, to the first semiconductor chip 100 and its top surface 200s may be the inactive surface 200b.

As another example, if the second semiconductor chip 200 faces up, the top surface 200s may be the active surface 200f. In the case of planarizing the resin layer 300 to form the planarized molding layer 350, the active surface 200f (not shown in FIG. 1d) may be protected by an insulation layer such that the active surface 200f may not be damaged. Additionally, if the resin layer 300 is excessively polished, there is a possibility that the active surface 200f may be damaged. To prevent such damage, the top surface 200s may further include a protective layer for protecting the active surface 200f from polishing damage.

Figure 1E:
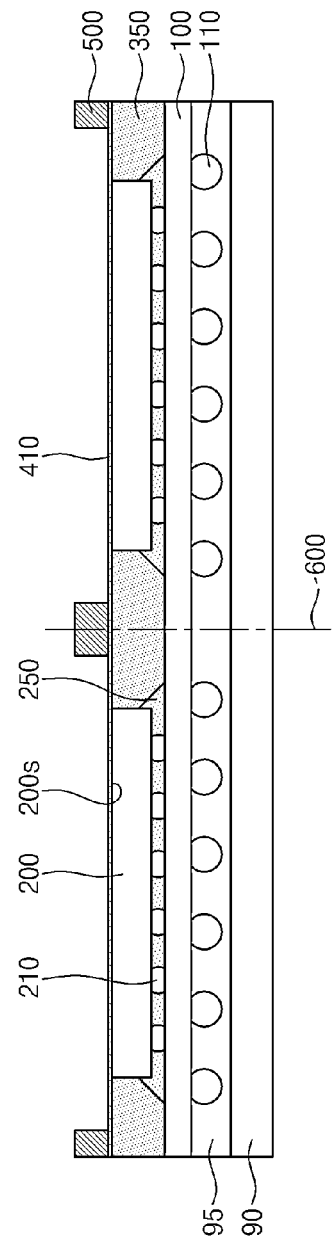

Referring to FIG. 1E, a first metal layer 410 may be formed and a mask pattern 500 may be formed on the first metal layer 410. The first metal layer 410 may be formed in a substantially continuous layer across the width of the semiconductor chip 200 and the planarized molding layer 350. The mask pattern 500 may be formed in a discontinuous layer through coating and patterning processes of a photoresist, thereby producing a layer that does not cover the second semiconductor chip 200 but covers a portion of the planarized molding layer 350. The mask pattern 500 may be overlapped with a scribe lane 600 for an efficient sawing process on the wafer.

The first metal layer 410 may be a barrier layer formed of a material such as Ti, Cr, Ta, Ni, TiW combinations thereof, or alloys thereof, which may prevent the diffusion of metals such as Cu, which degrades the electrical characteristics of the second semiconductor chip 200.

After forming the mask pattern 500, the second metal layer 420 can be formed without forming the first metal layer 410. In some cases, the bonding strength between the second metal layer 420 and the semiconductor chip 200 and between the second metal layer 420 and the planarized molding layer 350 may become weaker; resulting in the second metal layer 420 becoming delaminated. Since the first metal layer 410 can decrease delamination of the second metal layer 420 from the second semiconductor chip 200, the first metal layer 410 may be formed before forming the second metal layer 410.

The first metal layer 410 may be formed through a plating process, chemical vapor deposition, physical vapor deposition, or soft-lithography technologies selected from the group consisting of a stencil printing process, a screen printing process, an ink-jet printing process, an imprinting process, an offset printing process. The first metal layer 410 may be thin, typically formed with a thickness of less than about 1 μm, e.g., about 0.5 μm to about 1 μm. The first metal layer 410 may be formed of a single layer structure serving as a metal (e.g., Cu) diffusion barrier layer. As another example, the first metal layer 410 may be formed of a multilayer structure where a seed layer is stacked on a diffusion barrier layer. Referring to FIG. 1F, a second metal layer 420 may be formed of a conductive material such as Cu or Au. If the second metal layer 420 is formed of Cu, the second metal layer 420 may be made by forming a Cu seed layer and the subsequent formation of a Cu layer using a plating process, e.g., electroless plating or electroplating. In some embodiments, a layer including Au/Ni or Ni may be additionally formed on top of the second metal layer 420 for wire bonding or forming a ball pad. However, the layer including Au/Ni or Ni may not be needed where a redistribution layer is formed. Alternatively, the second metal layer 420 may be formed by depositing an Au seed layer and the subsequent formation of an Au layer on the Au seed layer by a plating process.

According to an embodiment of the inventive concept, the second metal layer 420 may be formed by depositing metal through thin film deposition processes such as a physical vapor deposition (PVD) techniques, chemical vapor deposition (CVD) techniques, atomic layer deposition (ALD) techniques, or soft-lithography technologies selected from the group consisting of stencil printing process, a screen printing process, an ink-jet printing process, an imprinting process, an offset printing process. The second metal layer 420 may be formed with a thickness of several μm to several tens of μms, e.g., about 50 μm. As another example, the second metal layer 420 may be formed after forming the mask pattern 500 without forming the first metal layer 410.

The shape of the second metal layer 420 may depend on the shape of the mask pattern 500. For example, the second metal layer 420 may be formed in a substantially continuous layer across the width of the second semiconductor chip 200 and formed having gaps between segments of the second metal layer 420 overlying the planarized molding layer 350. The first metal layer 410 and the second metal layer 420 may constitute a heat sink layer 401 that may directly contact the top surface 200s of the semiconductor chip 200. As another example, if the first metal layer 410 is not formed, the heat sink layer 401 may be formed of the second metal layer 420.

In some embodiments, the heat sink layer 401 may also directly contact the top surface 351 of the planarized molding layer 350 as well as the exposed top surface 200s of the second semiconductor chip 200.

In some embodiments, in cross-sectional view, the heat sink layer 401 may extend in a straight line across the planarized molding layer 350 and the top surface 200s of the second semiconductor chip 200 at an interface thereof.

Referring to FIG. 1G, the mask pattern 500 may be removed through, for example, an ashing process. A subsequent sawing process may be made easier if the first metal layer 410 is divided along the scribe lane 600. The separation of the first metal layer 410 may be accomplished through, for example, an etching process. As another example, if the first metal layer 410 is not too thick to make the sawing process difficult, the separation process of the first metal layer 410 may be skipped. As a further example, without forming the mask pattern 500, the second metal layer 420 may be formed in a continuous layer substantially identical to the first metal layer 410. In this case, to perform a sawing process easily, the second metal layer 420 and the first metal layer 410 may be divided in advance through an etching process, along the scribe lane 600. Accordingly, the heat sink layer 401 at the wafer level may be separated into individual heat sink layers divided from each other and mounted on an individual semiconductor package.

Figure 1H:
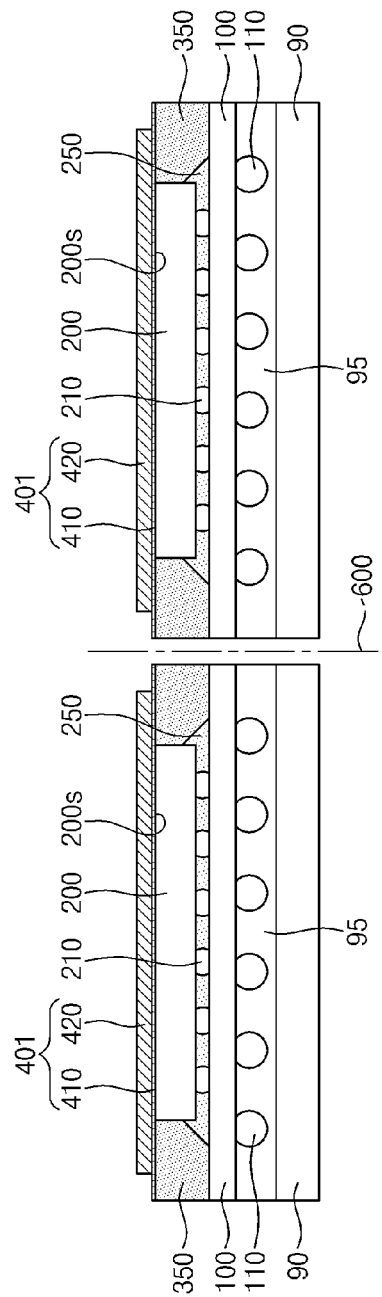

Referring to FIG. 1H, the sawing process may be performed along the scribe lane 600. For example, the planarized molding layer 350, the first semiconductor chip 100, the adhesive layer 95, and the carrier 90 at a wafer level may be divided along the scribe lane 600 to singulate the first semiconductor chips, e.g., the first semiconductor chips 100, from the wafer. The sawing process may be accomplished through, for example, a cutting wheel or laser.

Figure 1I:
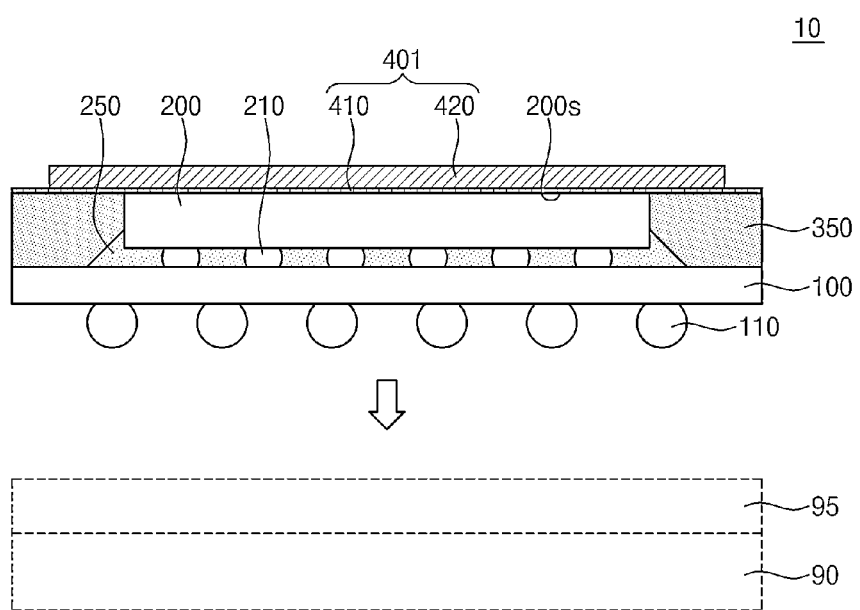
Figure 1L:
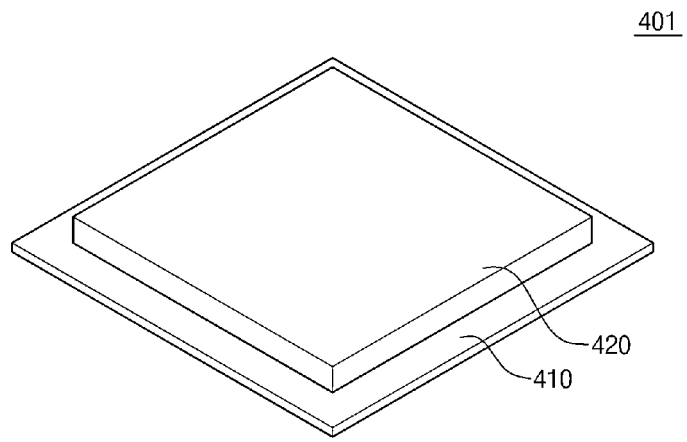
FIG. 1L is a perspective view of a heat sink layer in a method of fabricating a semiconductor package according to an embodiment of the inventive concept.

Referring to FIG. 1I, the adhesive layer 95 and the carrier 90 may be detached or separated from each other. Accordingly, a chip stack 10 may be formed where the second semiconductor chip 200 is stacked on the first semiconductor chip 100 and the heat sink layer 401 directly contacts the top surface 200s of the second semiconductor chip 200, which is exposed by the planarized molding layer 350. Since the planarized molding layer 350 may support the chips 100 and 200, the carrier 90 may not be needed during the sawing process. Accordingly, after forming the planarized molding layer 350, the sawing process may be performed after removing the adhesive layer 95 and the carrier 90.

Referring to FIG. 1J, the chip stack 10 may be mounted on a package substrate 80 to form a semiconductor package 1. The package substrate 80 may be a printed circuit board (PCB). One or more external terminals 82 such as solder balls may be further attached to the package substrate 80 to electrically connect the semiconductor package 1 to any electrical device. The chip stack 10 and the package substrate 80 may be electrically connected to each other by one or more solder balls 110 disposed between the first semiconductor chip 100 and the package substrate 80. An under filling layer 85 may selectively be formed between the first semiconductor chip 100 and the package substrate 80 to surround the solder balls 110 to improve the solder joint reliability.

According to this embodiment, since the semiconductor package 1 includes the heat sink layer 401 that may directly contact the top surface 200s of the second semiconductor chip 200, heat generated from the second semiconductor chip 200 and the first semiconductor chip 100 can be easily released through the heat sink layer 401. Accordingly, with such features of the semiconductor package 1, efficient heat dissipation can be achieved.

The heat sink layer 401 may have a flat plate shape as shown in FIG. 1L. As another example, since the heat sink layer 401 is further patterned to have an uneven form, a heat sink layer 402 having an increased surface area may be formed as shown in FIG. 2G or 2H, which will be described later.

The semiconductor package 1 may be a System-in-Package (SiP) including the stacked chips 100 and 200 of different types. The semiconductor package 1 typically requires high power consumption and thus excessive heat generation may occur. However, according to principles of various embodiments, the heat sink layer 401 that may directly contact the chips 100 and/or 200 may provide effective heat dissipation or radiation.

According to some embodiments of the present disclosure, layers of various materials such as molding layer/adhesive layer/thermal interface material (TIM) layer may not need to be formed between the second semiconductor chip 200 and the heat sink layer 401. Accordingly, deterioration of adhesiveness due to mismatches in Coefficients of Thermal Expansion (CTE) between different materials may be substantially reduced in the semiconductor package 1. Moreover, warpage of the semiconductor package 1 may be reduced due to rigidity of the heat sink layer 401 and strong adhesion between the second semiconductor chip 200 and the heat sink layer 401. According to some embodiments, since the heat sink layer 401 may be directly formed, a height of the semiconductor package 1 may be set according to a thickness adjustment of the heat sink plate 401 so that a small form factor may be realized. Additionally, since the semiconductor package 1 is formed through a wafer level process, manufacturing costs may be reduced compared to a chip level process.

The semiconductor package 1 may be modified in various ways. As one example, as shown in FIG. 1K, a semiconductor package 1a may include the second semiconductor chip 200 having a through via (or heat via or through silicon via) 220 connected to the heat sink layer 401. The through via 220 may not be electrically connected to the memory circuit 200c. Therefore, the through via 220 may be a dummy via to transfer heat from the memory circuit 200c into the heat sink layer 401. According to this embodiment, since the second semiconductor chip 200 may be bonded, e.g., flip-chip bonded, to the first semiconductor chip 100, even when the memory circuit 200c that typically generates heat may be more adjacent to the first semiconductor chip 100 than the heat sink layer 401, heat may be directly and quickly transferred to the heat sink layer 401 through the through via 220.

Figure 1M:
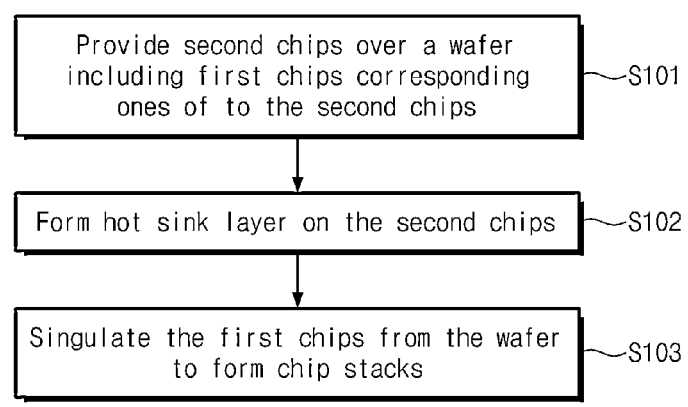
FIG. 1M is a flow chart illustrating a method of fabricating a semiconductor package according to an embodiment of the inventive concept.

In sum, as illustrated in FIG. 1M, according to an embodiment of the inventive concept, a semiconductor stack package 10 may be fabricated by providing a plurality of separated second semiconductor chips 200 over a wafer including first semiconductor chips 100 at a wafer level at step s101; forming a heat sink layer 401 that contacts at least a portion of the top surfaces 200s of the second semiconductor chips 200 at step s102. Then, the semiconductor stack package 10 may be formed by singulating the plurality of first semiconductor chips 100 from the wafer to form a plurality of chip stacks where the plurality of separated second semiconductor chips 200 are stacked on the corresponding ones of the singulated first semiconductor chips 100 at step s103. In some embodiments, the heat sink layer 401 may not contain a resin or a polymer.

In another embodiment, the principles of the inventive concept may be applied not just to a stack-type package, but also to a semiconductor package which is not a stack-type package, e.g., a semiconductor package having a chip without another chip stacked on top thereof. Such a semiconductor package may be fabricated by providing a wafer having semiconductor chips fabricated therein; forming a heat sink layer over the wafer, the heat sink layer contacting top surfaces of the semiconductor chips; and thereafter, singulating the plurality of semiconductor chips from the wafer.

In some embodiments, the heat sink layer 401 may be formed by forming a seed layer and then forming a layer of nano-tube formed on the seed layer.

In another embodiment, as shown in FIG. 1N, a third semiconductor chip 300 may overlie the second semiconductor chip 200 to form a semiconductor stack package 20. In this case, the first semiconductor chip 100 may be a logic device and second and third chips 200, 300 may be memory devices. The second semiconductor chip 200 and the third semiconductor chip 300 may be interconnected through conductive bumps, solder balls, or any other inter-chip connectors 310. The heat sink layer 401 including a first metal layer 410 and a second metal layer 420 formed on a top surface 300s of the third semiconductor chip 300.

In this embodiment, a through via 320 is formed to be coupled to the through via 220 and also to the heat sink layer 401. According to one aspect of the inventive concept, the components of the third semiconductor chip 300 may be the same or similar components to the second semiconductor chip 200. However, the inventive concept is not limited to this particular structure. For example, the first and second semiconductors 200, 300 may be interconnected through the through vias 220, 320, but they can also be interconnected through other interconnection methods such as wire bonding or any other equivalent connection methods. In this respect, some or all of the components of the semiconductor packages of a particular embodiment of the present disclosure may be employed in other embodiments of the present disclosure. Also, some or all of the components (such as an underfilling layer 460 or a planarized molding layer 450) of the present disclosure may be either replaceable or optional depending on the application.

Embodiment 2

FIGS. 2A through 2F are sectional views illustrating a method of fabricating a semiconductor package according to some embodiments of the inventive concept. FIGS. 2G and 2H are perspective views of heat sink layers in a method of fabricating a semiconductor package according to some embodiments of the inventive concept.

Referring to FIG. 2A, a first semiconductor chip 100 may be mounted on a carrier 90 with an adhesive layer 95 interposed therebetween and a second semiconductor chip 200 may be stacked on the first semiconductor chip 100. An underfilling layer 250 surrounding a conductive bump or solder ball 210 may be formed between the first semiconductor chip 100 and the second semiconductor chip 200. A planarized molding layer 350 may be formed by forming and planarizing a resin layer 300 (shown in broken lines). The top surface 200s of the second semiconductor chip 200 may be the inactive surface 200b as shown in FIG. 1B or the active surface 200f as shown in FIG. 1C.

Referring to FIG. 2B, a first metal layer 410 and a mask pattern 502 may be formed. The first metal layer 410 may be a continuous layer across the width of the second semiconductor chip 200 and the planarized molding layer 350. Alternatively, the mask pattern 502 may be formed in a discontinuous layer to cover portions of the second semiconductor chip 200 and the planarized molding layer 350.

Figure 2C:
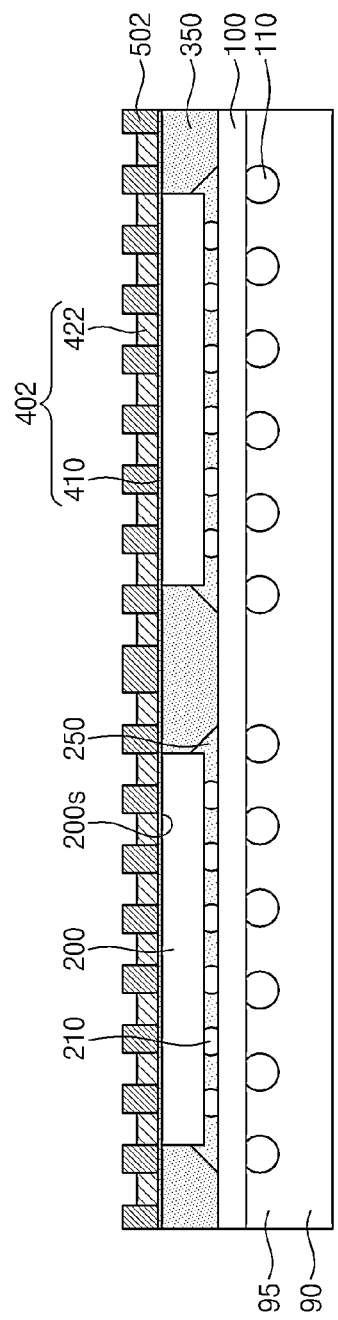

Referring to FIG. 2C, a second metal layer 422 may be formed. For example, the second metal layer 422 may be formed through electroless plating or electroplating of metal, with its form depending on the mask pattern. The second metal layer 422 may be formed in a discontinuous layer along the top surface 200s of the second semiconductor chip 200.

In other words, the first metal layer 410 is formed in a substantially continuous layer across the width of the second semiconductor chip 200, and the second metal layer 422 is formed having gaps between segments of the second metal layer 422 along the width of the second semiconductor chip 200.

As another example, the second metal layer 422 may be formed using deposition techniques or soft-lithography technologies described above. The second metal layer 422 may be formed after forming the mask pattern 502 without forming the first metal layer 410. According to the above examples, a heat sink layer 402 including the first metal layer 410 and the second metal layer 422 or only the second metal layer 422 may be formed at the wafer level.

Figure 2D:
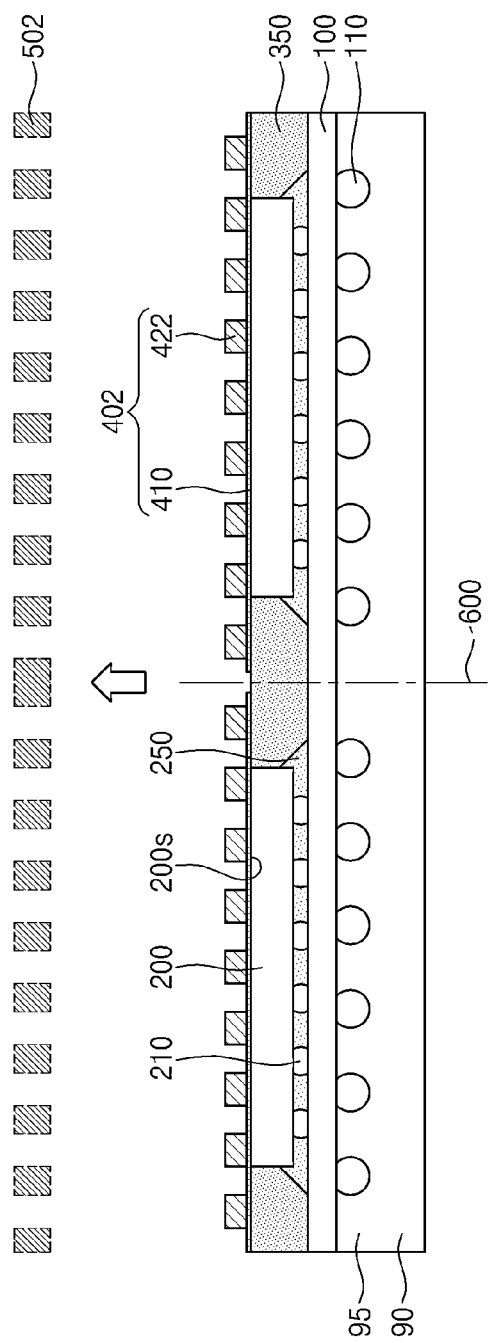

Referring to FIG. 2D, after the mask pattern 502 is removed, a sawing process may be performed to divide the first metal layer 410, the planarized molding layer 350, the first semiconductor chip 100, the adhesive layer 95, and the carrier 90 along a scribe lane 600 by using, for example, a cutting wheel or laser. Before the sawing process, the first metal layer 410 may be divided in advance along the scribe lane 600 using an etching process. According to the above process, the heat sink layer 402 may be divided into individual heat sink layers each included in a separate semiconductor package.

Figure 2E:
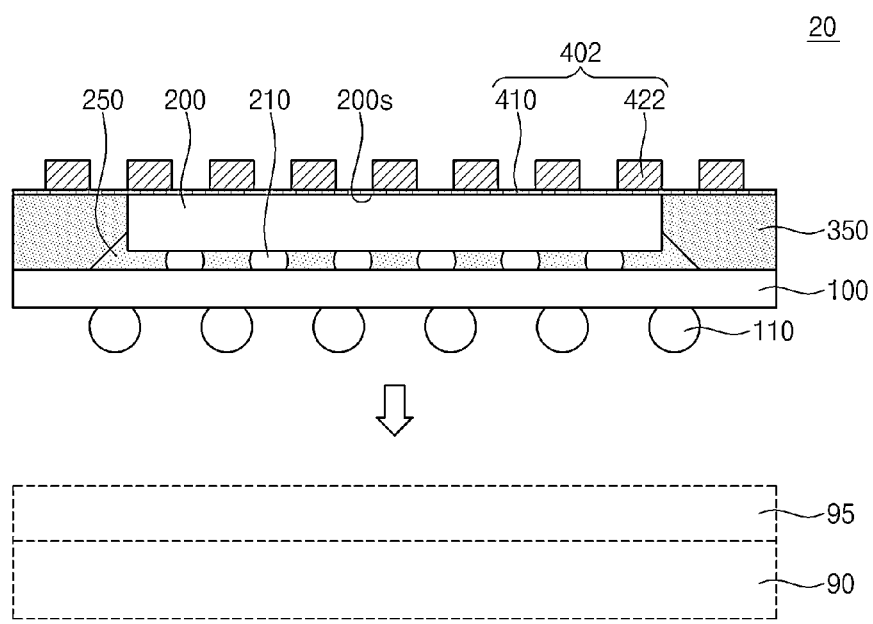
Figure 2G:
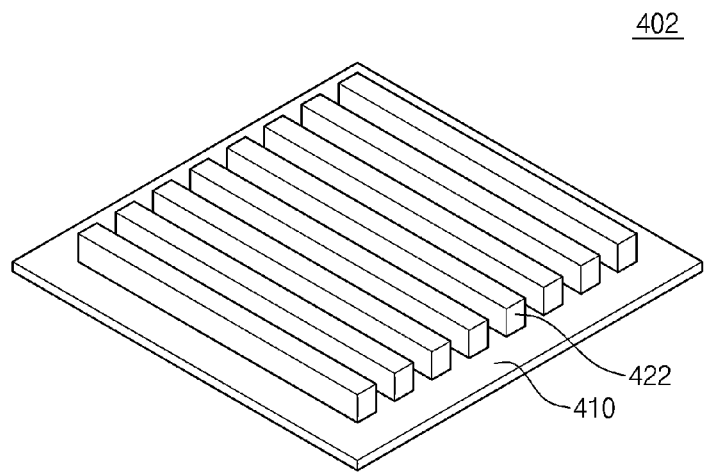
FIGS. 2G and 2H are perspective views of heat sink layers in a method of fabricating a semiconductor package according to still another embodiment of the inventive concept.
Figure 2H:
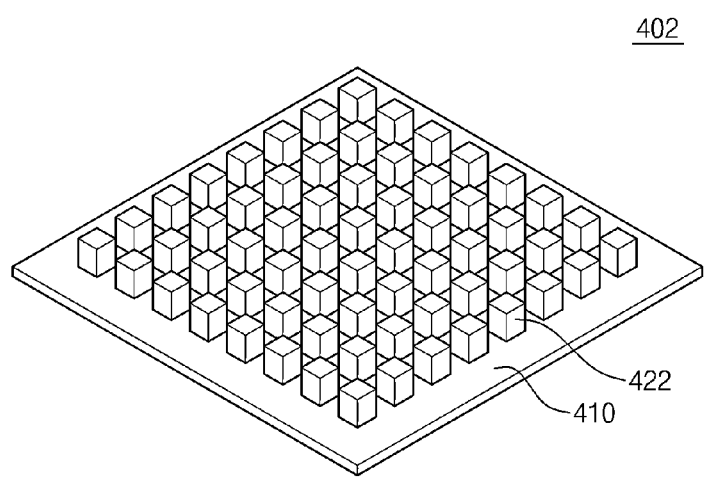

Referring to FIG. 2E, a chip stack 20 may be formed, where the adhesive layer 95 and the carrier 90 are separated. In the chip stack 20, the second semiconductor chip 200 is stacked on the first semiconductor chip 100 and the heat sink layer 402 that may directly contact the second semiconductor chip 200 is formed. As another example, the chip stack 20 may be formed through a sawing process after removing the adhesive layer 95 and the carrier 90.

Referring to FIG. 2F, the chip stack 20 may be mounted on the package substrate 80 such as PCB to form a semiconductor package 2. External terminals 82 may be attached to the package substrate 80. According to some embodiments, an under filling layer 85 may be additionally formed between the first semiconductor chip 100 and the package substrate 80 to surround one or more solder balls 110. The second semiconductor chip 200 may further include a through via or heat via 220 connected to the heat sink layer 402 to provide a heat transfer path from the second semiconductor chip 200 to the heat sink layer 402 for efficient heat dissipation.

According to this embodiment, the heat sink layer 402 may have a fin shape as shown in FIG. 2G or a pillar shape as shown in FIG. 2H. The heat sink layer 402 having the fin or pillar shape may have an increased surface area compared to a flat shape, so that the heat sink layer 402 can dissipate the heat more effectively.

Embodiment 3

FIGS. 3A through 3E are sectional views illustrating a method of fabricating a semiconductor package according to an embodiment of the inventive concept.

Referring to FIG. 3A, a first semiconductor chip 100 may be mounted on a carrier 90 with an adhesive layer 95 interposed therebetween, and a second semiconductor chip 200 may be stacked on the first semiconductor chip 100. An under filling layer 250 surrounding a solder ball 210 may be formed between the first semiconductor chip 100 and the second semiconductor chip 200.

In some embodiments, the underfilling layer 250 may cover a portion of the sidewall 207 of the semiconductor chip 200.

Referring to FIG. 3B a heat sink layer 403 may be formed to surround the top and side walls of the second semiconductor chip 200 and extend to a top surface 100s of the first semiconductor chip 100. Accordingly, the heat sink layer 403 may cover the top surface 200s and sidewalls 200t of the second semiconductor chip 200 and the top surface 100s of the first semiconductor chip 100. The heat sink layer 403 may directly contact the top surface 200s and/or the sidewalls 200t of the semiconductor chip 200.

In some embodiments, the heat sink layer 405 may cover substantially all of the top surface 200s and a majority of the sidewalls 200t of the second semiconductor chip 200. The top surface 100s of the first semiconductor chip 100 may be the active surface 100f or the inactive surface 100b as shown in FIG. 1B or 1C. The heat sink layer 403 may include only the second metal layer 423 or the first and second metal layers 413 and 423. The first metal layer 413 may be a diffusion barrier layer depending on the application.

Figure 3C:
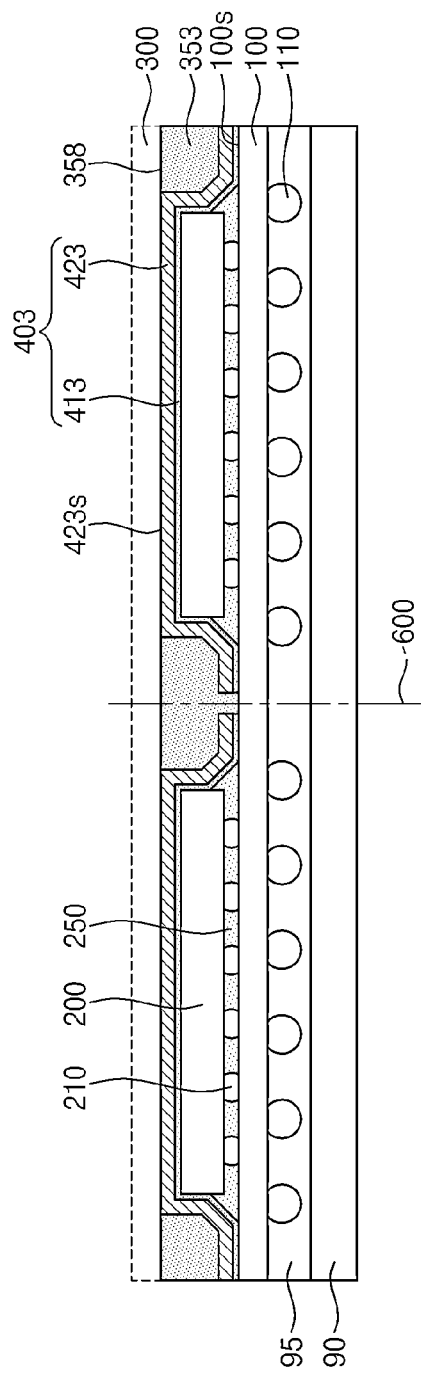

Referring to FIG. 3C, a planarized molding layer 353 may be formed by forming the resin layer 300 over the second semiconductor chip 200 and planarizing the resin layer 300 such that a top surface 358 of the planarized molding layer 353 may be substantially at the same level as the top surface 423s of the heat sink layer 403. In other words, the top surface 423s of the heat sink layer 403 may be substantially coplanar with the top surface 358 of the planarized molding layer 353. Since the planarized molding layer 353 exposes the heat sink layer 403, the heat sink layer 403 may effectively dissipate heat.

As another example, the resin layer 300 may remain over the second semiconductor chip 200 to cover the heat sink layer 403. In this case, the number of processing steps can be reduced and, as a result, manufacturing costs can be reduced.

Before forming the resin layer 300, the heat sink layer 403 may be divided along the scribe lane 600. A sawing process may be difficult if the sum of a thickness (e.g., about 1 μm) of the first metal layer 413 and a thickness (e.g., about 50 μm) of the second metal layer 423 is too thick. Accordingly, before the sawing process, an etching process may be performed to divide the second metal layer 423 or both the second metal layer 423 and the first metal layer 413 to make the subsequent sawing process easier.

After forming the resin layer 300 or the planarized molding layer 353, a sawing process may be performed to divide the resin layer 300 or the planarized molding layer 353, the first semiconductor chip 100, the adhesive layer 95, and the carrier 90 along the scribe lane 600.

Figure 3D:
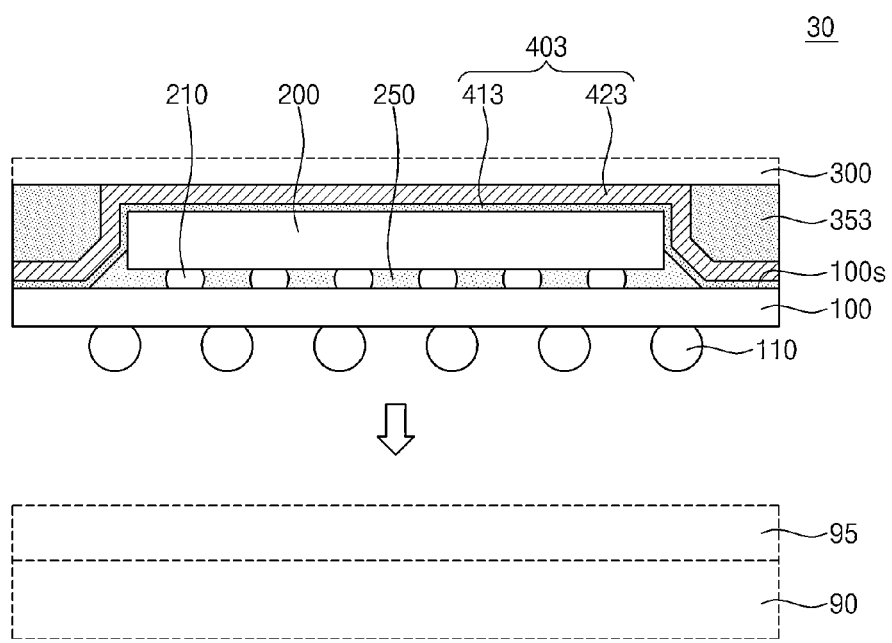

Referring to FIG. 3D, a chip stack 30 may be formed, where the adhesive layer 95 and the carrier 90 are separated; the second semiconductor chip 200 is stacked on the first semiconductor chip 100; and the heat sink layer 403 directly contacts the second semiconductor chip 200 and extends to cover the top surface of the first semiconductor chip 100. Or, after removing the adhesive layer 95 and the carrier 90, a sawing process may be performed to form the chip stack 30.

Figure 3E:
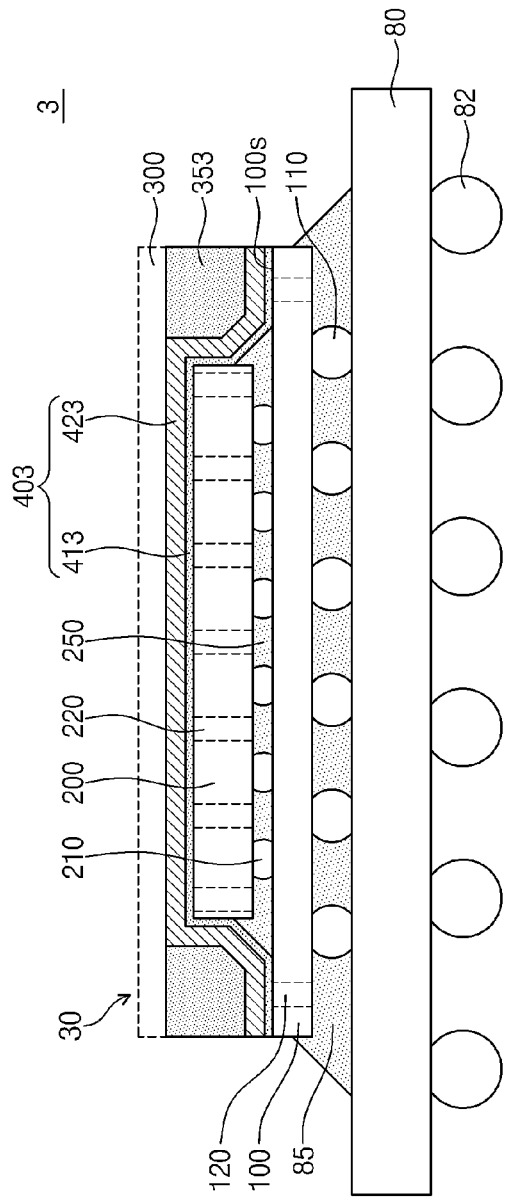

Referring to FIG. 3E, the chip stack 30 may be mounted on a package substrate 80 such as PCB to form a semiconductor package 3. One or more external terminals 83 may be further attached to the package substrate 80. An under filling layer 85 may be further formed between the first semiconductor chip 100 and the package substrate 80 to surround one or more solder balls 110.

The second semiconductor chip 200 may further include a through via 220 connected to the heat sink layer 403. Since the heat sink layer 403 extends to the top surface 100s of the first semiconductor chip 100, the first semiconductor chip 100 may further include a through via 120 that is connected to the heat sink layer 403 and transfer heat from the first semiconductor chip 100 to the heat sink layer 403. In other words, the through via 120 may be coupled to a portion of the heat sink layer 403 where the heat sink layer 403 is in contact with the top surface 200s of the corresponding one of first semiconductor chip 100. According to this embodiment, the heat sink layer 403 extending to the first semiconductor chip 100 may effectively dissipate heat from the second semiconductor chip 200 and also from the first semiconductor chip 100.

Embodiment 4

FIGS. 4A through 4G are sectional views illustrating a method of fabricating a semiconductor package according to an embodiment of the inventive concept.

Referring to FIG. 4A, a first semiconductor chip 100 may be bonded on a carrier 90 with an adhesive layer 95 and a second semiconductor chip 200 may be stacked on the first semiconductor chip 100 with an adhesive layer 240. The second semiconductor chip 200 may be electrically connected to the first semiconductor chip 100 through a bonding wire 260.

Referring to FIG. 4B, a planarized molding layer 354 that exposes a top surface 200s of the second semiconductor chip 200 may be formed. As one example, a resin layer 300 may be formed to cover the second semiconductor chip 200. Then, a portion of the resin layer 300 may be removed through, for example, an etching process, which may form a planarized molding layer 354 having a recess region 302 that exposes a substantially central region of the top surface 200s of the second semiconductor chip 200. The planarized molding layer 354 may cover an edge region of the top surface 200s of the second semiconductor chip 200 to which the bonding wire 260 is connected. The top surface 200s of the second semiconductor chip 200 may be an active surface. The active surface may be protected by an insulation layer formed thereon such that the active surface is not damaged during the etching process. Alternatively, the top surface 200s may additionally include a protective layer 230 to cover the active surface of the second semiconductor chip 200 such that the active surface of the second semiconductor chip 200 can be protected from damage during the etching process.

Figure 4C:
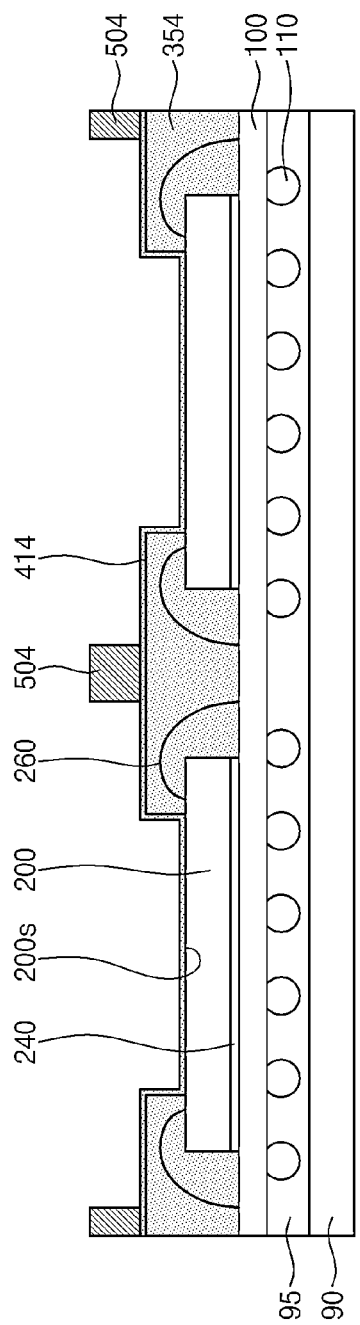

Referring to FIG. 4C, a first metal layer 414 may be formed on the planarized molding layer 354 and the second semiconductor chip 200 through an electroless plating or deposition technique, and a mask pattern 504 may be formed on the first metal layer 414. The mask pattern 504 may be selectively formed on a region of the planarized molding layer 354. Or, the mask pattern 504 may be formed to cover the top surface 200s of the second semiconductor chip 200 and to cover portions of the planarized molding layer 353 as shown in FIG. 2B. The first metal layer 414 may be a diffusion barrier layer.

Figure 4D:
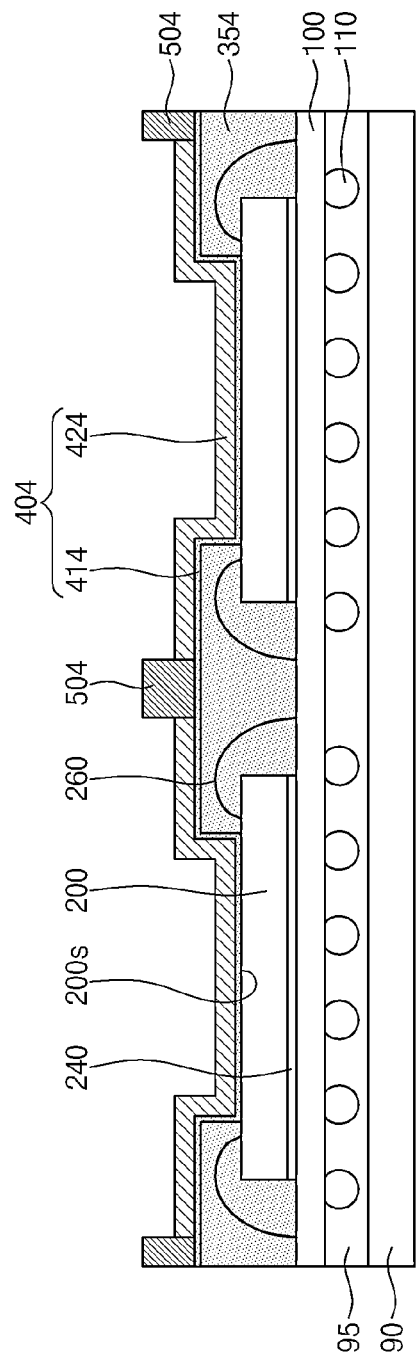

Referring to FIG. 4D, a second metal layer 424 may be formed on the first metal layer 424 such that a heat sink layer 404 of a wafer level may be formed. The second metal layer 424 may be formed of a conductive material such as metal through a plating process using the first metal layer 414 as a seed, deposition, or a printing process. The heat sink layer 404 may have a recessed form corresponding to a profile of the planarized molding layer 354. Accordingly, the heat sink layer 404 may directly contact the center region of the top surface 200s of the second semiconductor chip 200 but may be spaced apart from an edge region contacting a bonding wire 260.

Figure 4E:
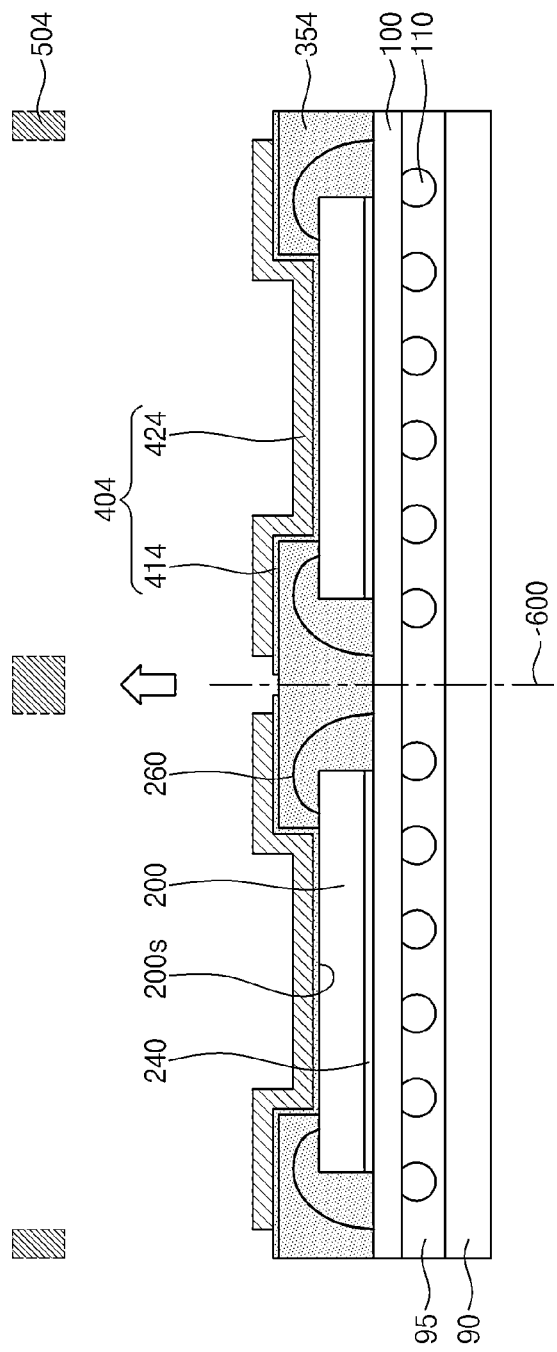

Referring to FIG. 4E, after removing the mask pattern 504, a sawing process may be performed along the scribe lane 600. Before the sawing process, a process for separating the heat sink layer 404 along the scribe lane 600 may be performed. The heat sink layer 404 may be separated from a wafer level to a chip level by the separation process.

Figure 4F:
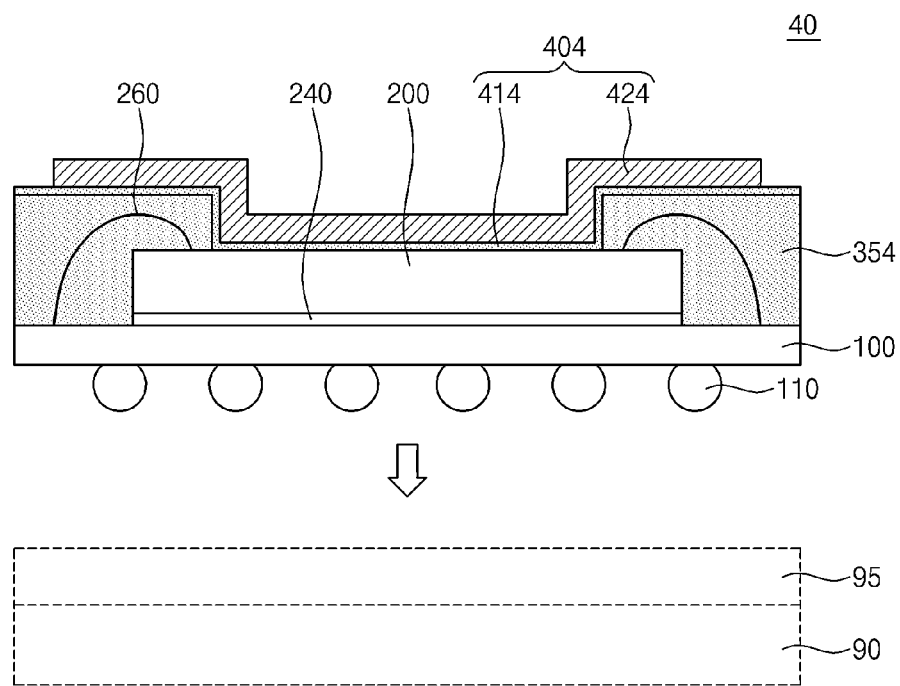

Referring to FIG. 4F, a chip stack 40 may be formed, where the adhesive layer and the carrier are separated; the second semiconductor chip 200 is wire-bonded to the first semiconductor chip 100; and the heat sink layer 404 that directly contact the second semiconductor chip 200 is included. As another example, the chip stack 40 may be formed by performing a sawing process after removing the adhesive layer 95 and the carrier 90.

Figure 4G:
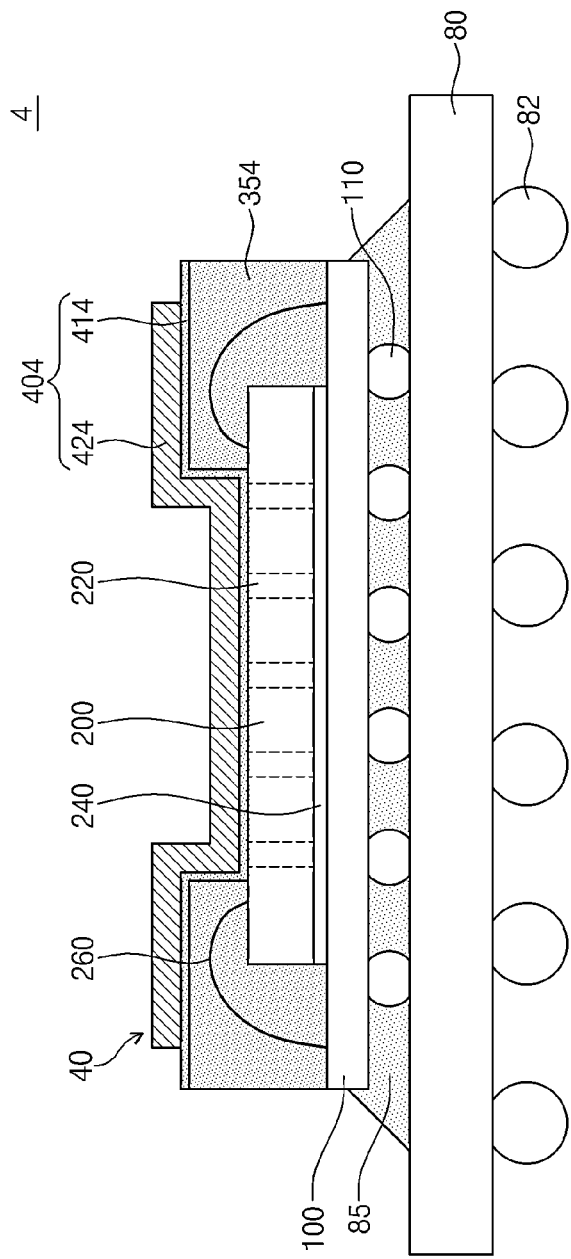

Referring to FIG. 4G, the chip stack 40 may be mounted on the package substrate 80 to form a semiconductor package 4. One or more external terminals and an under filling layer 85 may be further formed. The memory chip 300 may further include a through via 220 connected to the heat sink layer 404. According to this embodiment, the planarized molding layer 354 may be formed to cover the bonding wire 260 but expose the second semiconductor chip 200. Therefore, the heat sink layer 404 may be formed to be directly contacted with the second semiconductor chip 200 to have an effective heat radiation.

Embodiment 5

FIGS. 5A through 5E are sectional views illustrating a method of fabricating a semiconductor package according to an embodiment of the inventive concept.

Referring to FIG. 5A, first semiconductor chips 100 may be mounted on a carrier 90 with an adhesive layer 95 therebetween and second semiconductor chips 200 may be stacked on the first semiconductor chips 100. An under filling layer 250 may be formed between the first semiconductor chip 100 and the second semiconductor chip 200 to surround one or more solder balls 210. In some embodiments, the underfilling layer 250 may cover a portion of the sidewall 207 of the semiconductor chip 200.

Then, a planarized molding layer 350 may be formed by forming and planarizing a resin layer 300. The planarized molding layer 350 may expose a top surface 200s of the second semiconductor chip 200. In some embodiments, substantially the entire top surfaces 200s of the second semiconductor chips 200 are exposed after the planarization processing step.

Then, a sawing process may be performed along a scribe lane 600 to divide the planarized molding layer 350, the first semiconductor chip 100, the adhesive layer 95, and the carrier 90.

Figure 5B:
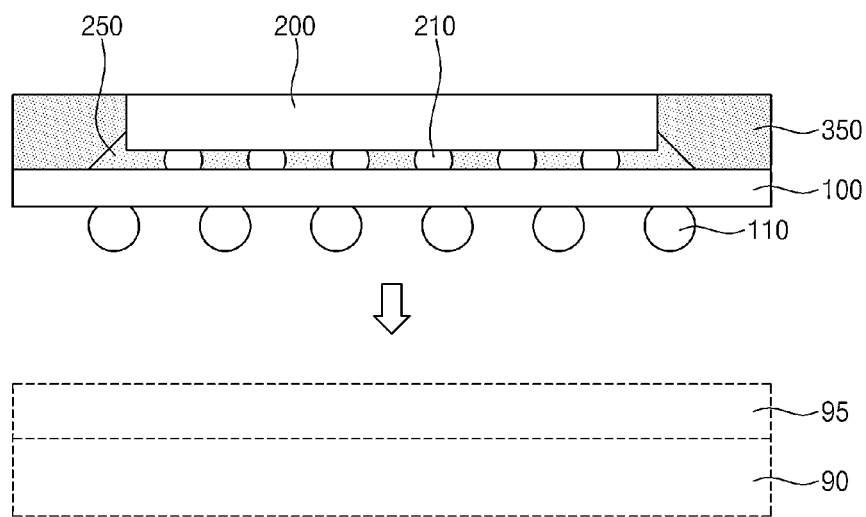

Referring to FIG. 5B, a chip stack 50 may be formed, where the adhesive layer 95 and the carrier 90 are separated; the second semiconductor chip 200 is stacked on the first semiconductor chip 100; and the second semiconductor chip 200 is exposed through the planarized molding layer 350. As another example, the chip stack 50 may be formed through a sawing process after removing the adhesive layer 95 and the carrier 90.

Referring to FIG. 5C, the chip stack 50 may be mounted on the package substrate 80. One or more external terminals 83 may be further attached to the package substrate 80 and an under filling layer 85 may be further formed between the first semiconductor chip 100 and the package substrate 80 to surround one or more solder balls 110.

Referring to FIG. 5D, a heat sink layer 405 including a second metal layer 425 may be formed. The heat sink layer 405 may surround the chip stack 50 and cover a top surface 80s of the package substrate 80. As a result, the heat sink layer 405 may be in contact with a top surface 350a and a sidewall 350b of the planarized molding layer 350.

Before forming the second metal layer 425, a first metal layer 415, such as a diffusion barrier layer, may be further formed to form the heat sink layer 405. According to this embodiment, the heat sink layer 405 may extend to the top surface 80s of the package substrate 80, thereby effectively dissipating heat generated from the chip stack 50 and also heat occurring from the package substrate 80 or transferred from the chip stack 50 to the package substrate 80. A semiconductor package 5 may be modified to further improve heat radiation as described later with reference to FIG. 5E.

Referring to FIG. 5E, a semiconductor package 5a may be formed to include through vias 84 and 220 that are connected to the heat sink layer 405 and provide a heat dissipation path. As one example, the through via 220 may be formed in the second semiconductor chip 200. Since the heat sink layer 405 extends to the top surface 80s of the package substrate 80, the through via 84 may be additionally formed in the package substrate 80. According to this embodiment, heat generated from the semiconductor package 5a may be more effectively dissipated through the heat sink layer 405 and also the through vias 220 and 84.

Therefore, according to an embodiment of the inventive concept, a package substrate 80 may have a through via 84 extending therethrough. The first and second semiconductor chips 100, 200 are sequentially disposed over the package substrate 80. The heat sink layer 405 may be in contact with the top surface 80s of the package substrate 80. The through via 84 may be coupled to a portion of the heat sink layer 405 where the heat sink layer 405 is in contact with the top surface 80s of the package substrate 80.

Application Example

Figure 6A:
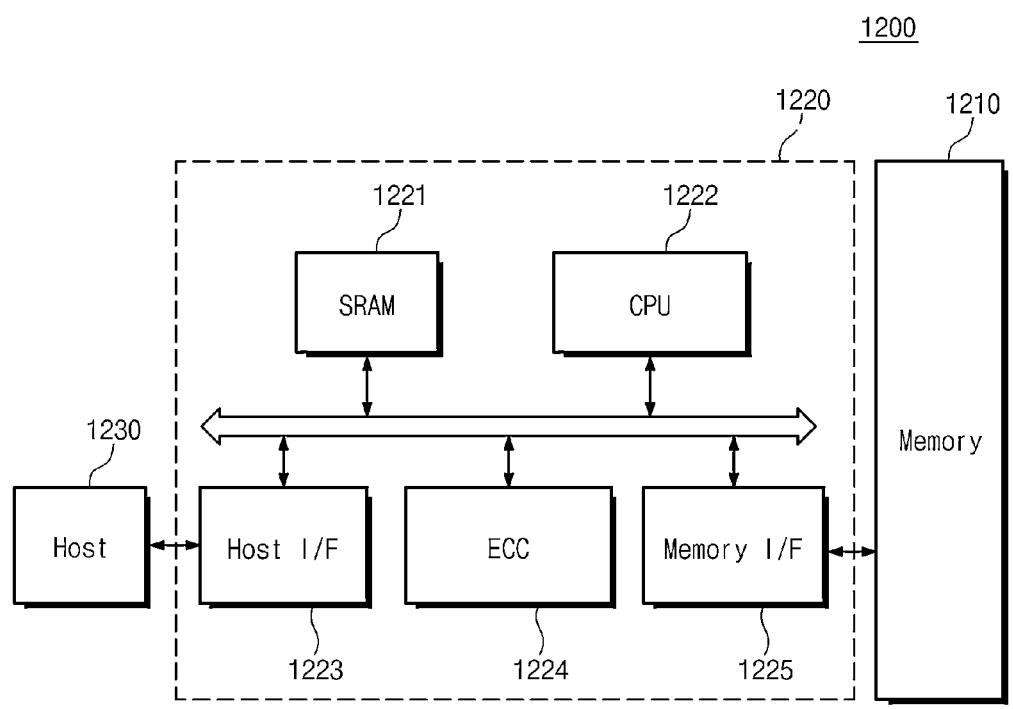
FIG. 6A is a block diagram illustrating a memory card with a semiconductor package according to one or more embodiments of the inventive concept.
Figure 6B:
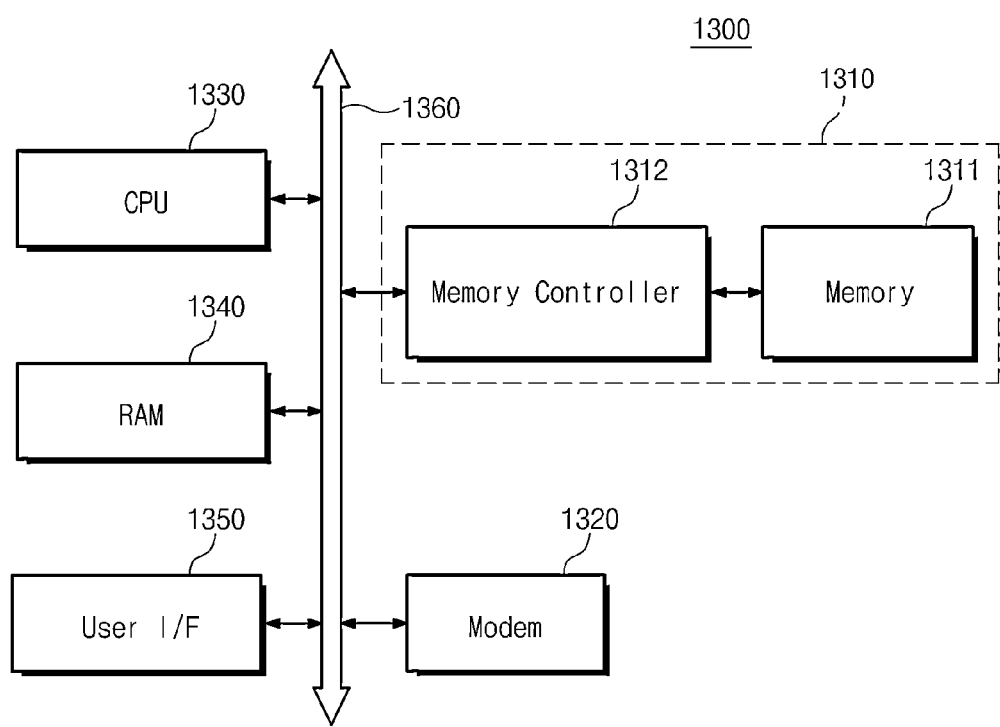
FIG. 6B is a block diagram illustrating an information processing system having an applied semiconductor package according to one or more embodiments of the inventive concept.

FIG. 6A is a block diagram illustrating a memory card with a semiconductor package according to various embodiments of the inventive concept. FIG. 6B is a block diagram illustrating an information processing system having an applied semiconductor package according to various embodiments of the inventive concept.

Referring to FIG. 6A, a semiconductor memory 1210 included in one or more of semiconductor packages fabricated according to various embodiments of the inventive concept may be employed to form the memory card 1200. For example, the memory card 1200 may include a memory controller 1220 for controlling general data exchange between a host (not illustrated) and a memory 1210. An SRAM 1221 may be used as an operating memory of a central processing unit (CPU) 1222. A host interface 1223 may include a data exchange protocol of a host connected to the memory card 1200. An error correction code (ECC) 1224 may detect and correct errors in data read from the memory 1210. A memory interface 1225 interfaces with the memory 1210. The CPU 1222 performs general control operations for data exchange with a memory controller 1220.

Referring to FIG. 6B, the information processing system 1300 may include a memory system 1310 according to some embodiments of the inventive concept. The information processing system 1300 may be included in a mobile device or a computer. As one example, the information processing system 1300 may include a memory system 1310, a modem 132, a CPU 1330, a RAM 1340, and a user interface 1350, which are electrically connected to a system bus 1360. The memory system 1310 includes a memory 1311 and a memory controller 1312 and may be substantially the same as the memory card 1200 of FIG. 6A. The memory system 1310 may store data processed by the CPU 1330 or data inputted from the external. The information processing system 1300 may be provided as a memory card, a solid state disk, a camera image sensor, and application chipsets of other ones. As one example, the memory system 1310 may include a semiconductor disk device and in this case, the information processing system 1300 may stably and reliably store a large capacity of data in the memory system 1310. The system 1300 may embody various electronic control systems requiring the memory 1311, and, for example, may be used in mobile phones, MP3 players, navigation devices, solid state disks/drives (SSD), or household appliances.

Figure 6C:
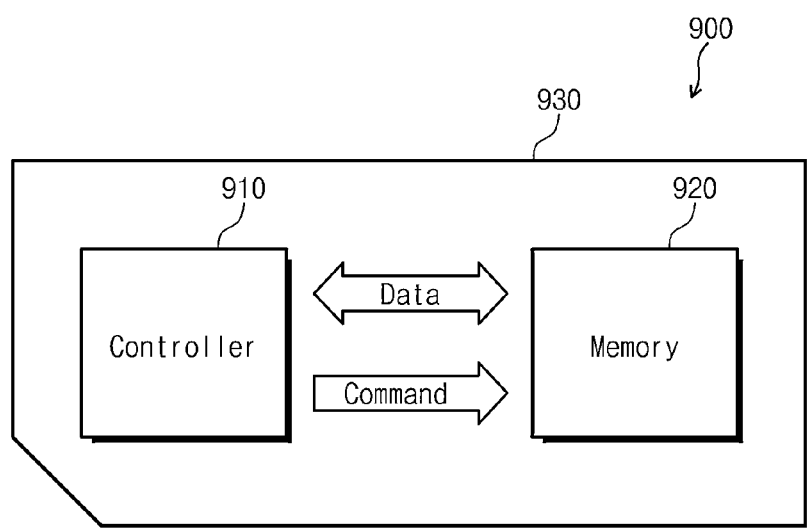
FIG. 6C is a block diagram of a memory card according to an embodiment of the inventive concept.

FIG. 6C is a block diagram of a memory card 900 according to an embodiment of the inventive concept.

Referring to FIG. 6C, the memory card 900 may include a controller 910 and a memory 920, which are housed in a housing 930. The controller 910 and the memory 920 may exchange electric signals. For example, the memory 920 and the controller 910 may exchange data according to instructions of the controller 910. Therefore, the memory card 900 may store data in the memory 920 or output data to outside from the memory 920.

For example, the memory 920 and/or the controller may be included in any of the semiconductor packages described previously. The memory card 900 may be used as a data storage medium for various portable devices. For example, the memory card 900 may be a multimedia card (MMC) or a secure digital card (SD).

According to the inventive concept, with formation of a heat sink that may directly contact a semiconductor chip, warpage due to weakened adhesion to a semiconductor chip, deterioration of heat release effectiveness, and mismatch of thermal expansion constants may be removed so that thermal and mechanical durability of a semiconductor package may be improved. Moreover, according to one aspect of the present disclosure, since the heat sink layer may be formed on a top surface of a semiconductor chip without an adhesive layer therebetween, the overall package thickness may be arbitrarily set so that a form factor of the semiconductor package may be reduced. Furthermore, according to the inventive concept, since a wafer level process, for example, described above in connection with FIG. 1M, can be employed to fabricate semiconductor packages, manufacturing costs may be reduced and, as a result, the price competitiveness of the overall product may be improved. The inventive concept may be generally applied without restriction to a flip chip bonding or wire bonding method of a semiconductor chip.

Specific embodiments of the invention will now be described in a non-limiting way.

In one embodiment, a method of fabricating a semiconductor stack package may comprise: providing a plurality of separated second semiconductor chips over a wafer including first semiconductor chips; forming a heat sink layer that contacts at least a portion of the top surfaces of the second semiconductor chips; and thereafter, singulating the plurality of first semiconductor chips from the wafer to form a plurality of chip stacks where the plurality of separated second semiconductor chips are stacked on the corresponding ones of the singulated first semiconductor chips.

In another embodiment, the heat sink layer may not contain a resin or polymer.

In some embodiment, the method of fabricating a semiconductor stack package may additionally comprise forming a molding layer using a compression mold to cover the first and second semiconductor chips; and exposing top surfaces of the plurality of second semiconductor chips by removing at least a portion of the molding layer. Exposing top surfaces of the plurality of second semiconductor chips may comprise simultaneously grinding the molding layer and the second semiconductor chips. Exposing the top surface of the semiconductor chip may comprise exposing a substantially entire top surface of the semiconductor chip.

In one embodiment, the heat sink layer may comprise a first metal layer and a second metal layer formed on the first metal layer.

In another embodiment, the first metal layer may comprise a material chosen from Ti, Cr, Ta, Ni, TiW, combinations thereof, or alloys thereof, wherein the second metal layer comprises Cu.

Alternatively, the heat sink layer further may comprise a third metal layer overlying the second metal layer, and where the third metal layer comprises Ni or Ni/Au.

In another embodiment, the first metal layer may be formed in a substantially continuous layer across the width of the second semiconductor chip, and where the second metal layer is formed having gaps between segments of the second metal layer along the width of the second semiconductor chip.

In one embodiment, the second metal layer may be formed in a substantially continuous layer across the width of the second semiconductor chip, and where the second metal layer is formed having gaps between segments of the second metal layer overlying the molding layer.

In some embodiments, the plurality of first semiconductor chips may be attached on a carrier with an adhesive layer interposed therebetween.

In still another embodiment, the heat sink layer may be formed using a technique chosen from plating, chemical vapor deposition, physical vapor deposition, atomic layer deposition (ALD) or soft lithography.

In one embodiment, the formation of the heat sink layer may comprise forming a seed layer and forming a layer of nano-tube formed on the seed layer.

In another embodiment, a molding layer may be formed using a compression mold to cover the first and second semiconductor chips and planarized to expose substantially the entire top surfaces of the plurality of second semiconductor chips. The heat sink layer may be in contact with a top surface and a sidewall of the planarized molding layer.

In some embodiments, a package substrate having a through via extending therethrough is provided. The first and second semiconductor chips are disposed over the package substrate. The heat sink layer may be in contact with a top surface of the package substrate, and the through via may be coupled to a portion of the heat sink layer where the heat sink layer may be in contact with the top surface of the package substrate.

According to an embodiment, a method of fabricating a semiconductor package includes: providing a wafer having semiconductor chips fabricated therein; forming a heat sink layer over the wafer, the heat sink layer contacting top surfaces of the semiconductor chips; and thereafter, singulating the plurality of semiconductor chips from the wafer. In some embodiment, the heat sink layer may be formed without having an adhesive layer between the heat sink layer and the semiconductor chips. In one embodiment, the heat sink layer may comprise a barrier layer and a conductive layer formed on the barrier layer, the conductive layer being formed by forming a seed layer on the barrier layer and forming a metal layer overlying the seed layer.

According to one aspect of the present disclosure, the seed layer may comprise Cu and the metal layer may comprise Cu.

According to another aspect of the present disclosure, the seed layer may comprise Au and the metal layer may comprise Au.

In some embodiment, a method of forming a semiconductor package, the method comprising: providing second semiconductor chips over corresponding ones of first semiconductor chips; and forming a heat sink layer that contacts top surfaces and sidewalls of the second semiconductor chips. The method may further comprise forming a molding layer overlying the resulting structure including the heat sink layer. The method may further comprise planarizing the molding layer to expose a top surface of the heat sink layer. The top surface of the heat sink layer may be substantially coplanar with a top surface of the planarized molding layer. The method may further comprise a through via extending through the second semiconductor chips and coupled to the heat sink layer. The heat sink layer may directly contact the top surfaces of the first semiconductor chips. The method may further comprise forming a through via extending through a corresponding one of the first semiconductor chips, where the through via is coupled to a portion of the heat sink layer where the heat sink layer is in contact with the top surface of the corresponding one of first semiconductor chips. The heat sink layer may directly contact the sidewalls of the second semiconductor chips.

In one embodiment, a method of forming a semiconductor package, the method comprising: providing a second semiconductor chip overlying a first semiconductor chip having through vias extending through at least a portion thereof; forming a molding layer covering the first and second semiconductor chips; planarizing the molding layer until a top surface of the second semiconductor chip is exposed such that a top surface of the planarized molding layer is substantially coplanar with the top surface of the second semiconductor chip; and forming a heat sink layer that directly contacts the exposed top surface of the second semiconductor chip and the top surface of the planarized molding layer. In cross-sectional view, the heat sink layer may extend in a straight line across the planarized molding layer and the top surface of the second semiconductor chip at an interface thereof. The second semiconductor chips may have through vias extending therethrough and directly coupled to the heat sink layer.

In some embodiment, a semiconductor package stack structure comprising: a first semiconductor chip; a second semiconductor chip overlying the first semiconductor chip; a planarized molding layer covering the second semiconductor chip and exposing a top surface of the second semiconductor chip, wherein a top surface of the planarized molding layer is substantially coplanar with the top surface of the second semiconductor chip; and a heat sink layer that directly contacts the exposed top surface of the second semiconductor chip and the planarized molding layer. The package stack structure may further comprise a third semiconductor chip overlying the second semiconductor chip, where the first semiconductor chip is a logic device and second and third chips are memory devices.

In one embodiment, a semiconductor package stack structure comprising: a second semiconductor chip over a first semiconductor chip; a heat sink layer that directly contacts a top surface and a sidewall of the second semiconductor chip; a planarized molding layer overlying the heat sink layer and exposing a top surfaces of the heat sink layer, where a top surface of the planarized molding layer is substantially coplanar with the top surface of the heat sink layer.

In another embodiment, a semiconductor package stack structure comprising: a second semiconductor chip over a first semiconductor chip; a planarized molding layer covering the first and second chips exposing a top surface of the second semiconductor chip, a heat sink layer that directly contacts the top surface of the second semiconductor chip, a top surface of the planarized molding layer, and a sidewall of the planarized molding layer, where a top surface of the planarized molding layer is substantially coplanar with the top surface of the second semiconductor chip. The semiconductor package stack structure may further comprise a through via in the package substrate, where the heat sink layer contacts a top surface of the package substrate, and where the through silicon via is coupled to a portion of the heat sink layer where the heat sink layer contacts the top surface of the package substrate.

In still another embodiment, a semiconductor package stack structure comprising: a first semiconductor chip; a second semiconductor chip overlying the first semiconductor chip; a planarized molding layer covering the second semiconductor chip and exposing a top surface of the second semiconductor chip, wherein a top surface of the planarized molding layer is substantially coplanar with the top surface of the second semiconductor chip; and a heat sink layer that contacts the exposed top surface of the second semiconductor chip and the planarized molding layer without an adhesive layer therebetween.

According to one aspect, the heat sink layer may not contain a resin or polymer. In one embodiment, a system comprising: a memory controller; and a memory adjacent to the memory controller, where at least one of the memory controller and the memory comprises: a first semiconductor chip; a second semiconductor chip overlying the first semiconductor chip; a planarized molding layer covering the second semiconductor chip and exposing a top surface of the second semiconductor chip, wherein a top surface of the planarized molding layer is substantially coplanar with the top surface of the second semiconductor chip; and a heat sink layer that contacts the exposed top surface of the second semiconductor chip and the planarized molding layer without an adhesive layer therebetween. Embodiments of the present application may also be applied to form ASICs, PLDs/Gate Arrays, DSPs, Graphics and PC chipsets. Also, embodiments of the present application can be used to form a storage device for notebook PCs and sub-notebooks for enterprises, Ultra-Mobile PCs (UMPC), and Tablet PCs.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.).

Various operations will be described as multiple discrete steps performed in a manner that is most helpful in understanding the invention. However, the order in which the steps are described does not imply that the operations are order-dependent or that the order that steps are performed must be the order in which the steps are presented.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A method of fabricating a semiconductor stack package, the method comprising:
    providing a plurality of separated second semiconductor chips over a wafer including a plurality of first semiconductor chips, wherein the plurality of separated second semiconductor chips are disposed over corresponding ones of the plurality of first semiconductor chips;
    forming a heat sink layer that contacts top surfaces of the plurality of separated second semiconductor chips; and
    thereafter, singulating the plurality of first semiconductor chips from the wafer to form a plurality of chip stacks where the plurality of separated second semiconductor chips are stacked on the corresponding ones of the plurality of first semiconductor chips that are singulated.

2. The method of claim 1, wherein the heat sink layer does not contain a polymer.

3. The method of claim 1, which further comprises:
    forming a molding layer using a compression mold to cover the plurality of first and second semiconductor chips; and
    exposing top surfaces of the plurality of separated second semiconductor chips by removing at least a portion of the molding layer.

4. The method of claim 3, wherein exposing top surfaces of the plurality of separated second semiconductor chips comprises simultaneously grinding the molding layer and the plurality of separated second semiconductor chips.

5. The method of claim 4, wherein exposing the top surfaces of the plurality of separated second semiconductor chips comprises exposing substantially entire top surfaces of the plurality of separated second semiconductor chips.

6. The method of claim 1, wherein the heat sink layer comprises a first metal layer and a second metal layer formed on the first metal layer.

7. The method of claim 6, wherein the first metal layer comprises a material chosen from Ti, Cr, Ta, Ni, TiW, combinations thereof, or alloys thereof, wherein the second metal layer comprises Cu.

8. The method of claim 7, wherein the heat sink layer further comprises a third metal layer overlying the second metal layer, and wherein the third metal layer comprises Ni or Ni/Au.

9. The method of claim 6, wherein the first metal layer is formed in a substantially continuous layer across the width of the second semiconductor chip, and wherein the second metal layer is formed having gaps between segments of the second metal layer along the width of the second semiconductor chip.

10. The method of claim 6, wherein the second metal layer is formed in a substantially continuous layer across the width of the second semiconductor chip, and wherein the second metal layer is formed having gaps between segments of the second metal layer overlying the molding layer.

11. The method of claim 1, further comprising attaching the plurality of first semiconductor chips on a carrier with an adhesive layer interposed therebetween.

12. The method of claim 1, wherein forming the heat sink layer comprises using a technique chosen from plating, chemical vapor deposition, physical vapor deposition, atomic layer deposition (ALD) or soft lithography.

13. The method of claim 1, wherein forming the heat sink layer comprises forming a seed layer and forming a layer of nano-tube formed on the seed layer.

14. The method of claim 1, further comprising:
forming a molding layer using a compression mold to cover the first and second semiconductor chips; and
planarizing the molding layer and exposing substantially the entire top surfaces of the plurality of second semiconductor chips,
wherein the heat sink layer is in contact with a top surface and a sidewall of the planarized molding layer.

15. The method of claim 14, further comprising providing a package substrate having a through via extending therethrough, wherein the first and second semiconductor chips are disposed over the package substrate, wherein the heat sink layer is in contact with a top surface of the package substrate, and wherein the through via is coupled to a portion of the heat sink layer where the heat sink layer is in contact with the top surface of the package substrate.

16. A method of forming a semiconductor package, the method comprising:

providing a second semiconductor chip overlying a first semiconductor chip having through vias extending through at least a portion thereof;
forming a molding layer covering the first and second semiconductor chips;
planarizing the molding layer until a top surface of the second semiconductor chip is exposed such that a top surface of the planarized molding layer is substantially coplanar with the top surface of the second semiconductor chip; and
forming a heat sink layer that directly contacts the exposed top surface of the second semiconductor chip and the top surface of the planarized molding layer.

17. The method of claim 16, wherein, in cross-sectional view, the heat sink layer extends in a straight line across the planarized molding layer and the top surface of the second semiconductor chip at an interface thereof.

18. The method of claim 16, wherein the second semiconductor chips have through vias extending therethrough and directly coupled to the heat sink layer.

* * * * *